United States Patent [19]
Deguchi et al.

[11] Patent Number: 5,414,746
[45] Date of Patent: May 9, 1995

[54] X-RAY EXPOSURE MASK AND FABRICATION METHOD THEREOF

[75] Inventors: Kimiyoshi Deguchi, Atsugi; Yoh Somemura, Zama; Kazunori Miyoshi; Tadahito Matsuda, both of Atsugi, all of Japan

[73] Assignee: Nippon Telegraph & Telephone, Tokyo, Japan

[21] Appl. No.: 146,474

[22] Filed: Nov. 1, 1993

Related U.S. Application Data

[63] Continuation of Ser. No. 871,959, Apr. 21, 1992.

[30] Foreign Application Priority Data

| Apr. 22, 1991 | [JP] | Japan | 3-116637 |
| May 24, 1991 | [JP] | Japan | 3-148119 |
| Jun. 28, 1991 | [JP] | Japan | 3-183470 |

[51] Int. Cl.⁶ .................................. G21K 5/00
[52] U.S. Cl. ........................ 378/35; 378/210
[58] Field of Search ........................ 378/34, 35

[56] References Cited

U.S. PATENT DOCUMENTS

| 4,035,522 | 7/1977 | Hatzakis | 378/35 |
| 4,816,361 | 3/1989 | Glendinning | 378/35 |
| 4,890,309 | 12/1989 | Smith et al. | 378/35 |

FOREIGN PATENT DOCUMENTS

| 57-62052A | 4/1982 | Japan |
| 61-292643A | 12/1986 | Japan |
| 62-67514A | 3/1987 | Japan |
| 1147458A | 6/1989 | Japan |
| 252416A | 2/1990 | Japan |

OTHER PUBLICATIONS

High-resolution x-ray lithography using a phase mask, Yoshiki Yamakoshi, et al., Applied Optics, vol. 25, No. 6, Mar. 15, 1986.

Influence of Phase Shift on Pattern Transfer in X-Ray Lithography, M. Weiss, et al., Microelectronic Engineering 6, (1987), 265-271, North-Holland.

Use of pi-phase shifting x-ray mask to increase the intensity slope at feature edges, Y.-C. Ku, et al., Massachusetts Institute of Technology.

Improving resolution in Photolithography with a Phase-Shifting Mask, Marc D. Levenson, et al.

The Phase-Shifting Mask II: Imaging Simulations and Submicrometer Resist Exposure, Marc D. Levenson, et al.

Optical Imaging with Phase Shift Masks, Mark D. Prouty, et al., University of California.

Mask Contrast Enhancement Using Beveled Edge in X-Ray Lithography, Shinya Hasegawa, et al., SORTEC Corporation, Ibaraki, Japan.

Primary Examiner—Craig E. Church
Attorney, Agent, or Firm—Kenyon & Kenyon

[57] ABSTRACT

An X-ray exposure mask comprises an X-ray transmission layer and an X-ray absorption layer formed on the X-ray transmission layer and being patterned. The X-ray absorption layer has a first region having a first thickness and a second region having a second thickness less than the first thickness.

18 Claims, 26 Drawing Sheets

X-RAY EXPOSURE MASK AND FABRICATION METHOD THEREOF

This application is a continuation of application Ser. No. 07/871,959, filed on Apr. 21, 1992.

BACKGROUND OF THE INVENTION

1. Field of the Invention

The present invention relates to an X-ray exposure mask to be used in fabrication processes of integrated circuits and fabrication method thereof.

2. Description of the Prior Art

In recent years, X-ray exposure method has been widely used in lithograph processing in order to increase the degree of integration in integrated circuits. Generally, X-ray masks used for X-ray exposure are fabricated by forming X-ray absorption patterns composed of an absorption layer absorbing X-rays formed on a membrane through which X-rays easily transmit. In 1:1 proximity X-ray exposure using the above mentioned X-ray mask, the thickness of the X-ray absorption layer becomes an important factor because mask contrast, which is defined by the ratio of the X-ray transmittance at the part without absorption materials to the X-ray transmittance at the part composed of absorption materials, is mainly determined by the thickness of the absorption layer. Mask contrast is given by $1/\exp(-\mu t)$ where t is the thickness of the absorption layer measured by nm, $\mu$ is the linear absorption coefficient with respect to the irradiated X-ray measured by 1/nm. Conventionally, as it is assumed that the higher the mask contrast, the better the exposure performance which includes the resolution of X-ray exposure, the resolution of transferred patterns and the exposure dose margin, the thickness of the absorption layer has been taken to be as large as possible, so long as the absorption patterns can be replicated. In this case, the value of mask contrast between 7 to 10 is adopted for a criteria whether the mask may be used or not. For example, in case that tantalum (Ta) is used for a material of the absorption layer, where the thickness of the absorption layer is 0.65 $\mu$m, the mask contrast is about 7 for the synchrotron radiation with the peak wavelength of 0.8 nm. Hence, conventional masks have been fabricated so that the thickness of absorption layers may be not less than 0.65 $\mu$m in order to make the mask contrast at least 7. This criteria for determining the thickness of absorption layers assumes that the plane size of patterns to be replicated is as large as 1 $\mu$m. In case of transferring fine patterns including less than 1 $\mu$m, what should be considered is an effective change of the exposure contrast due to the X-ray diffraction and the mutual interference.

The X-ray after passing through the membrane gives rise to diffraction. In addition, the X-ray passing through the absorption layer suffers the decrease of the intensity and the phase shift, and furthermore, the X-ray after passing through the absorption layer interferes with diffracted X-rays. The range where diffraction and interference occur is dependent upon the wavelength of the X-ray and the proximity gap, that is, the distance between the mask and the sample. The range where diffraction and interference occurs most ofter is limited to the area closest to pattern edges. Therefore, the smaller the pattern size, the larger the effect of diffraction and interference which leads to changes in the transmitted X-ray intensity distribution.

In case diffraction and interference occur, the effective exposure contrast can not be defined simply by the ratio of the X-ray transmittance at the location without absorption materials to the X-ray transmittance at the location composed of absorption materials. Alternately, in this case, the effective contrast should be estimated on the basis of the X-ray intensity reaching to the sample substrate facing the absorption layer pattern. In some cases where diffraction and interference occur, as described in detail later, it may be found that the X-ray intensity distribution on the region on the sample corresponding to the membrane is not uniform but has a minimum value and that the X-ray intensity distribution on the region of the sample corresponding to the X-ray absorption pattern contains a maximum peak. In this case, the effective exposure contrast can be formulated by the ratio of the minimum value of the X-ray intensity distribution on the region not corresponding to the absorber pattern to the maximum value of the X-ray intensity distribution on the region corresponding to the absorber pattern.

The effect of the X-ray diffraction and the mutual interference is described in published papers, M. Weiss et al., Microelectric Eng., 6, pp. 265–271, 1987 and Y. C. Ku et al., J. Vac. Sci. & Technol., B6, pp. 150–153, 1988. In these papers, the exposure resolution depends upon the phase shift and the intensity change of X-ray through the absorption layers.

In the following, the effect of the X-ray diffraction and the mutual interference over the effective exposure contrast is described.

In FIG. 1, a cross-sectional view of a conventional X-ray exposure mask is shown. The mask comprises an X-ray transmission layer (membrane) 1 with a thickness of 2 $\mu$m composed of silicon nitride and an X-ray absorption layer or X-ray absorber 2 with a thickness of Da=0.65 $\mu$m composed of tantalum (Ta) formed on the X-ray transmission layer 1. The X-ray absorber 2 is so patterned as to have an open window 3 with its width W1 being 0.1 $\mu$m. Since this mask has a thick X-ray absorber 2, if the width of the open window 3 is large enough and greater than 1 $\mu$m, the effective exposure contrast (in this case, it is defined by the ratio of the maximum X-ray exposure intensity on the region of the sample which corresponds to the region on the X-ray transmission layer 1 where the X-ray absorber 2 does not exist to the maximum X-ray exposure intensity on the region of the sample which corresponds to the region where the X-ray absorber 2 exists), and the exposure dose margin (it determines the range on the sample where the X-ray exposure patterns can be replicated in responsive to patterns of the X-ray absorber 2) on the sample can be established to be relatively high, and the size of transferred patterns can be well controlled. However, in the case where the width of the window is as small as 0.1 $\mu$m, there may be problems such as the X-ray diffraction and the X-ray mutual interference.

In FIGS. 2A and 2B, the X-ray exposure intensity distribution on the surface of the sample in irradiating the X-ray having the peak wavelength of 0.8 nm is shown. As for FIG. 2A, the distance between the X-ray mask and the surface of the sample, that is, the proximity gap G, is 30 $\mu$m. As for FIG. 2B the proximity gap G is 20 $\mu$m. In FIGS. 2A and 2B, the horizontal axis represents the distance measured from a point on the sample surface corresponding to the center of the window 3 along the direction of the width of the window, and the vertical axis represents the relative value of the X-ray exposure intensity. The X-ray after passing through the window 3 diffracts and the X-ray after passing through the X-ray absorber layer 2 gives rise to phase shift, and finally, the diffracted X-rays from the window 3 and the X-rays transmitted through the X-ray absorber 2 interfere with each other. As a result, the X-ray exposure intensity distribution on the sample is influenced considerably, and as shown in FIGS. 2A and 2B, the effective exposure contrast and the exposure dose margin are very low. Specifically, in the case where the proximity gap G is 30 μm, as shown in FIG. 2A, the X-ray exposure intensity at the sample positions corresponding to an inner area under the X-ray absorber 2 is higher than the X-ray exposure intensity at the sample position corresponding to the window 3. This means that the pattern defined by the X-ray absorber 2 can not be transferred completely onto the sample. This situation does not change whether the shape of the window 3 is a well-like with a right square form or a long extended groove form.

In FIG. 3, a cross-sectional view of another conventional X-ray exposure mask is shown. The structure of the mask shown in FIG. 3 is almost similar to that shown in FIG. 1 except that the thickness Db of the X-ray absorber 2' is 0.3 μm. In FIGS. 4A and 4B, the X-ray exposure intensity distribution on the surface of the sample in irradiating the X-ray having the peak wavelength of 0.8 nm is shown. As for FIG. 4A, the distance between the X-ray mask shown in FIG. 3 and the surface of the sample, that is, the proximity gap G, is 30 μm. As for FIG. 4B the proximity gap G is 20 μm. Similarly as in FIGS. 2A and 2B, the effect of the mutual interference of the diffracted X-ray and the transmitted X-ray is shown. In this case, the effective exposure contrast and the exposure dose margin are higher than those in the case of the mask shown in FIG. 1, but the amount of X-rays transmitted through the X-ray absorber also increases, and therefore the mask contrast is as low as from 2 to 3. The mask shown in FIG. 3 has a defect such as a fog resulting from a leakage of irradiated X-ray inside the masked part.

In FIG. 5, a cross-sectional view of a conventional X-ray mask having lines-and-spaces patterns is shown. On the 2 μm-thick X-ray transmission layer (membrane) 1 composed of silicon nitride, a 0.65 μm-thick tantalum film is formed as the X-ray absorber 4. The X-ray absorber 4 is composed of repetitive patterns of absorber 4A where the width W3 of the absorber is 0.1 μm and the distance W2 between the adjacent absorber is 0.1 μm. In other words, the windows 5 having a 0.1 μm-width are spaced at a distance of 0.1 μm. Reference numeral 4B is an X-ray absorber for defining the windows at both sides, the width of which is generally greater than that of the absorber 4A.

In FIG. 6, the X-ray exposure intensity distribution on the surface of the sample in irradiating the X-ray having the peak wavelength of 0.8 nm is shown, where the mask shown in FIG. 5 is placed on the sample with the proximity gap G of 20 μm. Due to the X-ray diffraction and the phase shift, the mask shown in FIG. 5 has such a defect which not only lowers the effective exposure contrast and the exposure dose margin but also is incapable of replicating the patterns exactly on the sample substrate in response to patterns defined by the X-ray absorber 4.

FIG. 7 is a cross-sectional view of the mask with the thickness Db of the X-ray absorption layer being 0.3 μm and with the other configuration features similar to those of the mask shown in FIG. 5. Under the same conditions as obtained in FIG. 6, in irradiating X-rays, the X-ray exposure intensity distribution on the sample is shown in FIG. 8. The X-ray intensity distribution shown in FIG. 8 shows better correspondence with the patterns given by the mask patterns than those in FIG. 5. Both the effective exposure contrast and the exposure dose margin are increased. However, the amount of transmitted X-rays is too large at the region on the sample where the outermost X-ray absorbers 4B exist, because the mask contrast is low. When using the mask shown in FIG. 8, the fog may occur at the periphery of the mask pattern.

FIG. 9 is a cross-sectional view of the X-ray mask having an isolated pattern. In FIG. 9, the X-ray mask is composed of a stripe-like or a square form X-ray absorber 6 of tantalum having its own width W4 and thickness Da, where Da is 0.65 μm and W4 is 0.2 μm, formed on the 2 μm-thick X-ray transmission layer 1 made of silicon nitride. FIG. 10 shows the X-ray exposure intensity distribution on the sample in irradiating X-rays having peak wavelength of 0.8 nm and placing the mask on the sample with proximity gap G of 20 μm. As the width W4 of the X-ray absorber 6 is as small as 0.2 μm, not only the exposure contrast and the exposure dose margin are relatively low, but also there are still problems such as being incapable of replicating the transferred patterns exactly on the sample substrate in response to patterns defined by the X-ray absorber 6. This is because the X-ray exposure intensity at the center of the X-ray absorber 6 measured in the horizontal direction is relatively larger than that measured at another positions.

FIG. 11 is a cross-sectional view of the mask with the thickness Db of the X-ray absorber 6' being 0.3 μm and with the other configuration features similar to those of the mask shown in FIG. 9. Under the same conditions as obtained in FIG. 10, in irradiating X-rays, the X-ray exposure intensity distribution on the sample is shown in FIG. 12. The X-ray exposure intensity at the center of the X-ray absorber 6' measured in the width direction is lower than that in FIG. 10. However, the X-ray exposure intensity at the region on the sample corresponding to the region where the X-ray absorber 6' exists is relatively higher than that in the case of the mask shown in FIG. 9, and therefore, the fog may occur at the region on the sample where the X-ray absorber 6' exists. This is a defect of the mask defined in FIG. 11.

In FIG. 13, a cross-sectional view of another conventional X-ray exposure mask is shown. The mask having X-ray absorbers formed on the X-ray transmission layer 1 composed of 2 μm-thick silicon nitride has patterned regions A, B and C, respectively, in the same manner as patterns shown in FIGS. 1, 5 and 9. In the region A, the width W1 of the window 3 defined by the X-ray absorbers 2 is 0.1 μm. In the region B, the width W2 of the window 5 defined between the adjacent X-ray absorbers 4A and 4B and the width W3 of the X-ray absorbers 4A is 0.1 μm. In the region C, the width W4 of the isolated X-ray absorber 6 is 0.1 μm. All of the absorbers 2, 4A, 4B and 6 are composed of tantalum films and their thickness Da is 0.65 μm. The X-ray exposure intensity distribution in the region A corresponding to 30 μm or 20 μm of the proximity gap is similar to that given by FIG. 2A or 2B. When the gap G is 20 μm, the X-ray exposure intensity distributions in the region B and the region C are similar to those given by FIGS. 6 and 10, respectively.

FIG. 14 shows a cross-sectional view of the mask with the thickness Db of the X-ray absorbers 2', 4'A, 4'B and 6' being 0.3 μm and with the other configuration features similar to those of the mask shown in FIG. 13. The patterns of the X-ray absorbers formed in the regions A' B' and C' are similar to those shown in FIGS. 3, 7 and 11, respectively. In using the mask shown in FIG. 14, the X-ray exposure intensity distributions on the sample at the region A, B and C are similar to those shown in FIGS. 4A, 4B, 8 and 12, respectively, under the same conditions as these figures.

For resolving a degradation of the resolution due to aforementioned diffraction of the light and its mutual interference, in optical lithography technologies, a phase-shift mask is proposed. The following references refer to this technology; Marc D. Levenson et al., IEEE Trans. ED., 29, pp. 1828–1836, 1982, Marc D. Levenson et al., IEEE Trans. ED., 31, pp. 753–763, 1984, Mark D. Prouty et al., SPIE, 470, pp 228–232, 1984, Japanese Patent Application Publication No. 62-50811 (1987), Japanese Patent Application Laying-open No. 58-173744(1983), 61-292643(1986), 62-67514(1987), and 1-147458(1989).

These papers disclose that a phase shifter is composed of materials enabling only a shift of the phase of the incident wave by 180° without reducing the intensity of the incident wave and that the phase shifter is placed at open aperture of the masking members in order to improve the exposure resolution. However, as the material used for the phase shifter is different from that used for the masking members, the fabrication process for forming the phase shifter may be more complicated and testing the fabricated mask may be difficult, either of which leads to practical problems. Phase shifter may be valid specifically for masks including regularly repetitive patterns, and hence, its applicable patterns are limited.

On the other hand, the following references disclose the technology for improving the resolution of the X-ray exposure by using the phase shifting effect; Japanese Patent Application Laying-open No. 2-52416 (1990), Shinya Hasegawa et al., Microelectronic Eng., 9, pp. 127–130, 1989, and Yoshiki Yamakoshi et al., Appl.Optics., 25, pp. 928–932, 1986. Hasegawa et al. propose that by tapering the side wall of the absorption layer patterns to cause the phase shift at the pattern edge, the X-ray intensity distribution may be improved. Yamakoshi et al. propose an X-ray mask on which a phase shifter is formed for shifting the phase by 180° by the analogy of the phase shifting mask used in the optical lithography. However, in the conventional X-ray mask using the phase shifting effect, since only one kind of phase shifter can be used regardless of the kinds and sizes of the patterns of the X-ray absorber, the. X-ray intensity distribution is improved under a limited condition of the kind and size of the X-ray absorber and the proximity gap.

As described above, in exposing X-rays by using conventional X-ray masks with higher contrast, even if the proximity gap (distance between the mask and the wafer) is greater than or equal to 30 μm, the mask containing only patterns with a size greater than 0.3 μm can be exactly replicated. However, in the case of using the mask containing patterns with a size less than 0.3 μm, the exposure resolution is greatly affected by the X-ray diffraction and interference, and specifically as for the patterns with plane size being less than 0.2 μm, pattern replication can not be performed easily. Hence, in order to replicate patterns less than 0.2 μm by using conventional X-ray masks, it has been necessary to reduce the proximity gap to about 10 μm, which is not practical. And furthermore, there is a limited number of combinations of patterns of the X-ray absorber and the value of the proximity gap which will attain an optimal X-ray exposure intensity distribution.

And furthermore, conventional methods for fabricating X-ray absorber patterns are categorized into two classes: dry etching technology and plating technology. In either technology, in case of increasing the thickness of the absorption layer, as the aspect ratio (the ratio of the height of the pattern to the width of the pattern) increases, it is very difficult to fabricate patterns exactly and precisely, which leads to deterioration of quality of fabricated absorber patterns estimated by sizes and shapes. Specifically, if the size of patterns is less than 0.25 μm, the problem is that the degree of deterioration of fabricated patterns is extremely high.

SUMMARY OF THE INVENTION

An object of the present invention is to provide an X-ray exposure mask enabling the transfer of fine patterns with higher resolution.

Another object of the present invention is to provide an X-ray exposure mask bringing a high effective exposure contrast at a proximity gap larger than 20 μm with respect to various patterns having different sizes and geometries leading to higher resolution in replicating patterns.

A further object of the present invention is to provide an X-ray exposure mask including various patterns having different geometries and sizes and having a high effective exposure contrast for such patterns and further the patterns can be replicated with high resolution.

An additional object of the present invention is to provide a method for fabricating precisely the above mentioned X-ray exposure masks.

In the first aspect of the present invention, an X-ray exposure mask comprises:

an X-ray transmission layer; and an X-ray absorption layer formed on the X-ray transmission layer and being patterned;

wherein the X-ray absorption layer has a first region having a first thickness and a second region having a second thickness, the second thickness being less than the first thickness.

Here, the X-ray absorption layer may have a pattern composed of a first part having a large plane projection area and a second part having a small plane projection area, and the first part may correspond to the first region and the second part may correspond to the second region. The second thickness, designated t measured in nano meters, of the second region may satisfy the equation $$30 < |360 (1-n) t/\lambda| < 120 \text{ and}$$

$$1 < 1/\exp(-\mu t) < 4$$

wherein n is a refractive index of the X-ray absorption layer, λ is a peak power wavelength of an incident X-ray measured in nano meter, and μ is a linear absorption coefficient of the X-ray absorption layer measured in a reciprocal of nano meters.

A plurality of the second region may be formed and arranged with an identical distance.

The first part may have the first region having the first thickness and the second region having the second thickness.

A width designated L of the second region may satisfy the equation $$L \leq 1.2 (G\lambda)^{\frac{1}{2}},$$

wherein G is a distance between a mask and an exposure sample, and λ is a peak power wavelength of an X-ray measured in micro meters.

The X-ray absorption layer may be patterned to have a window and a first X-ray absorber and a second X-ray absorber facing each other closely via the window, and each of the first X-ray absorber and the second X-ray absorber may have the second region with the second thickness at a side whereby the window is defined, and the first region with the first thickness outside of the second region.

A width designated L of the second region may satisfy the equation $$L \leq 1.2(G\lambda)^{\frac{1}{2}},$$

wherein G is a distance between a mask and exposure sample, and λ is a peak power wavelength of an X-ray measured in micro meters.

The first X-ray absorber and the second X-ray absorber may be extended in parallel with each other.

A center portion of the first part may be the first region with the first thickness, and peripheral portion of the first part may be the second region with the second thickness.

A width designated L of the second region may satisfy the equation $$L \leq 1.2 (G\lambda)^{\frac{1}{2}},$$

wherein G is a distance between a mask and an exposure sample, and λ is a peak wavelength of an X-ray measured in micro meters.

In the second aspect of the present invention, an X-ray exposure mask comprises:

an X-ray transmission layer; and an X-ray absorption layer formed on the X-ray transmission layer and patterned;

wherein the X-ray absorption layer has at least one pattern of a first pattern including a first X-ray absorber and a second X-ray absorber confronting with each other closely via a window, a second pattern including a third X-ray absorber, a fourth X-ray absorber and a plurality of fifth X-ray absorbers placed between the third and fourth X-ray absorber and arranged with an interval and a third pattern composed of a sixth X-ray absorber extended in a striped geometry; and a region of the first and second X-ray absorbers forms a first region having a first thickness and a region of the first and second X-ray absorbers from an end part defining the window to the first region forms a second region having a second thickness smaller than the first thickness;

a region of the third and fourth X-ray absorbers far from the fifth X-ray absorber forms a third region having the first thickness and a region the third and forth X-ray absorber from an end part facing to the fifth X-ray absorber to the third region forms a fourth region having the second thickness and each of the plurality of fifth X-ray absorbers forms a fifth region having the second thickness; and a central part of the sixth X-ray absorber forms a sixth region having the fifth thickness and end parts along peripheries of the sixth X-ray absorber forms a seventh region having the second thickness.

The X-ray absorption layer may have a pattern composed of a first part having a large plane projection area and a second part having a small plane projection area, and the first part may correspond to the first region and the second part may correspond to the second region.

The second thickness, designated t measured in nano meters, may satisfy the equation $$30 < |360 (1-n) t/\lambda| < 120 \text{ and}$$

$$1 < 1/\exp(-\mu t) < 4$$

wherein n is a refractive index of the X-ray absorption layer, λ is a peak power wavelength of an incident X-ray measured in nano meter, and λ is a linear absorption coefficient of the X-ray absorption layer measured in a reciprocal of nano meter.

Width of the second, fourth and seventh regions may not exceed $$1.2(G\lambda)^{\frac{1}{2}},$$

wherein G is a distance between a mask and an exposure sample, and λ is a peak power wavelength of an X-ray measured in micro meter.

The plurality of fifth X-ray absorbers may be arranged with an identical interval.

In the third aspect of the present invention, a process for fabricating an X-ray exposure mask comprises the steps of:

forming an X-ray transmission layer on a substrate;

forming an X-ray absorption layer on the X-ray transmission layer;

forming a first etching mask layer including patterns on the X-ray absorption layer;

forming a channel on the X-ray absorption layer by unisotropic etching process using the first etching mask layer;

forming a second etching mask layer by removing a designated amount of the first etching mask layer from its side face and its upper face by isotropic etching of the first etching mask layer; and forming an X-ray absorption layer composed of specific patterns, the X-ray absorption layer having an edge part, the thickness of which is smaller than the thickness of a region below the second etching mask layer, by using the second etching mask layer as a mask and by unisotropic etching process for removing the X-ray absorption layer.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
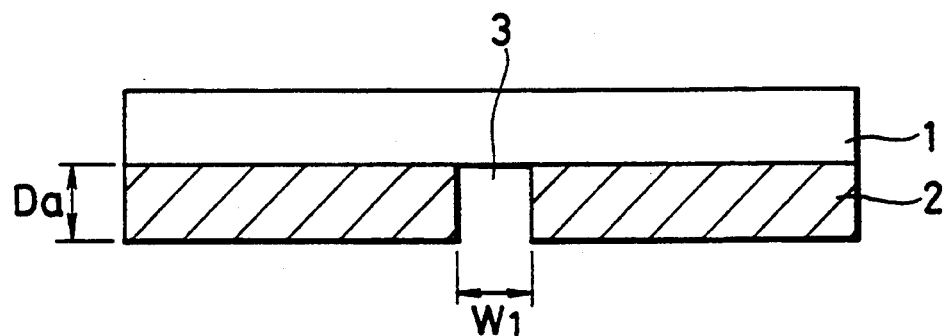
FIG. 1 is a schematic cross-sectional view showing a conventional X-ray exposure mask.
Figure 3:
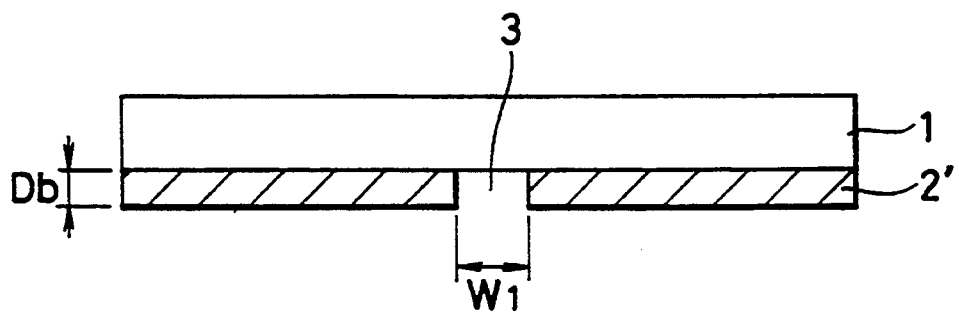
FIG. 3 is a schematic cross-sectional view showing a conventional X-ray exposure mask.
Figure 2A:
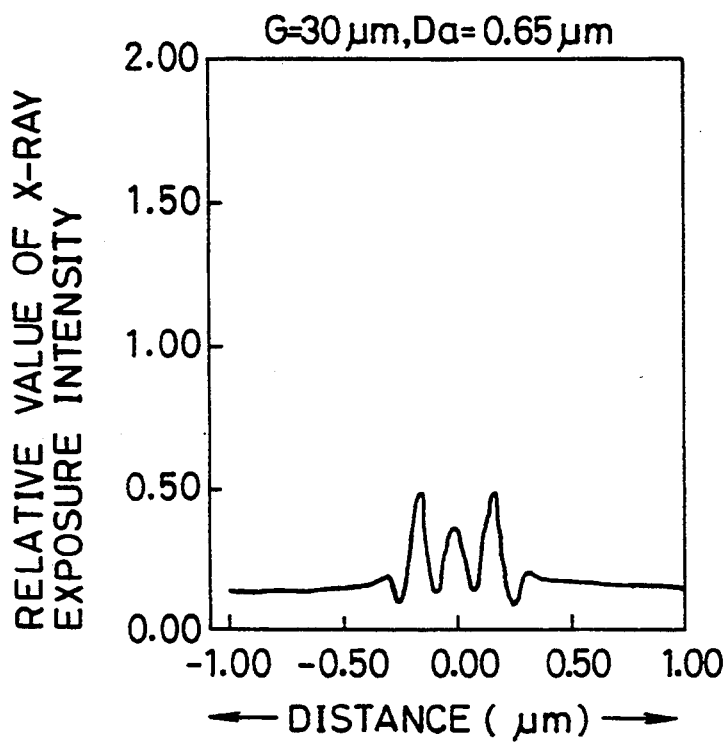
FIGS. 2A and 2B are diagrams showing an X-ray exposure intensity distribution on a sample using the conventional X-ray exposure mask shown in FIG. 1.
Figure 2B:
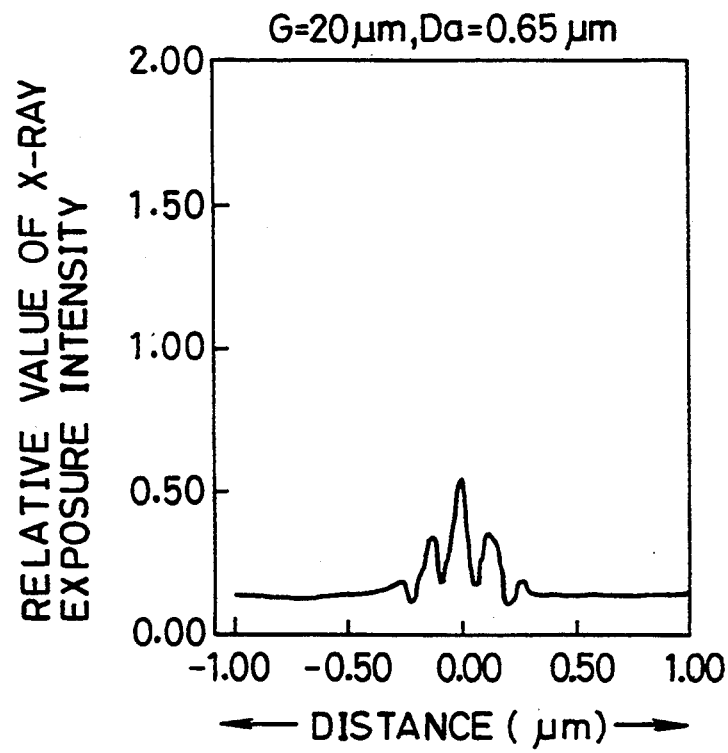
Figure 4A:
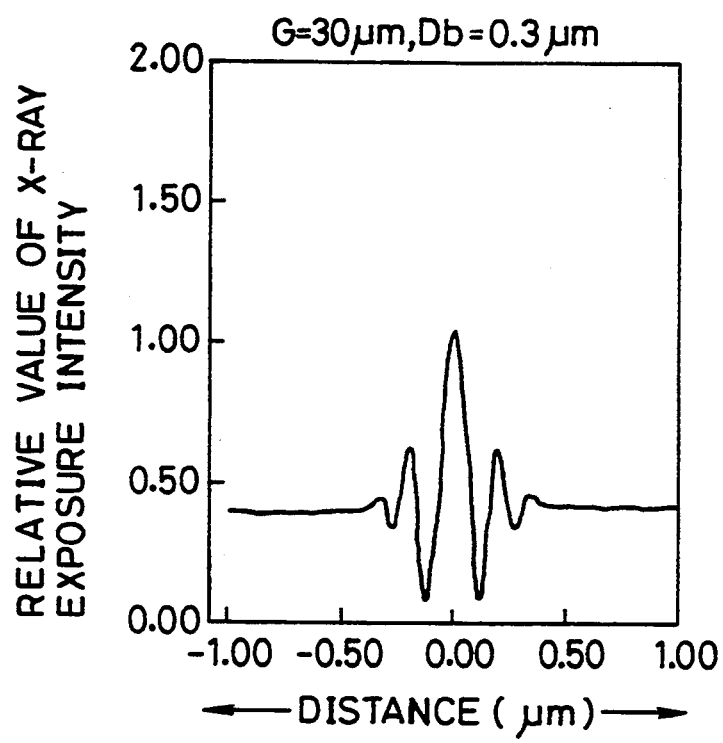
FIGS. 4A and 4B are diagrams showing an X-ray exposure intensity distribution on a sample using the conventional X-ray exposure mask shown in FIG. 3.
Figure 4B:
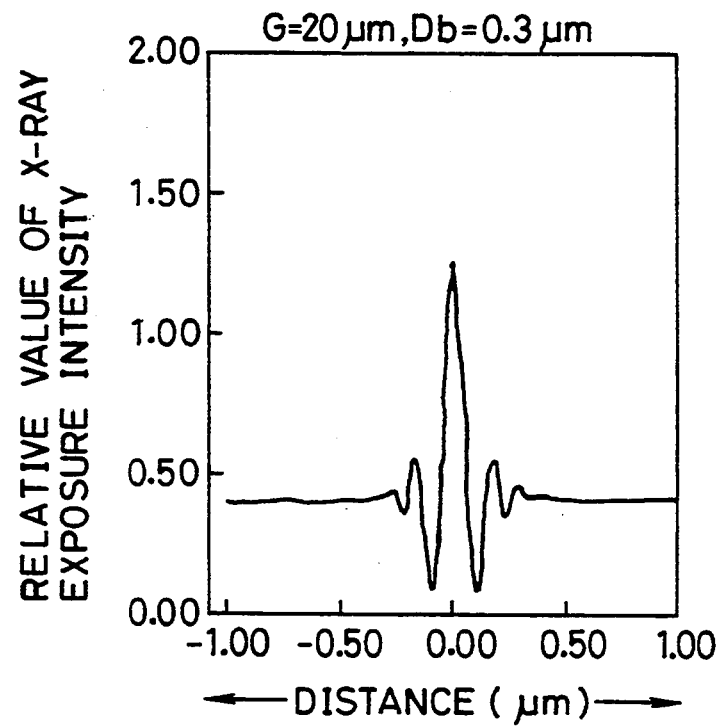
Figure 5:
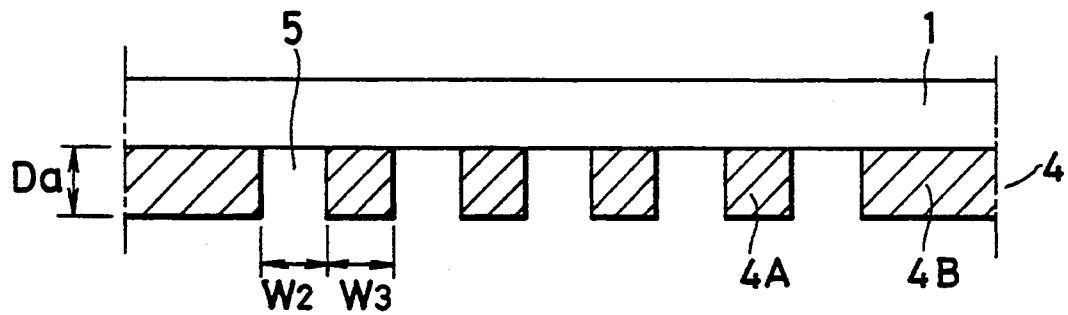
FIG. 5 is a schematic cross-sectional view showing a conventional X-ray exposure mask.
Figure 6:
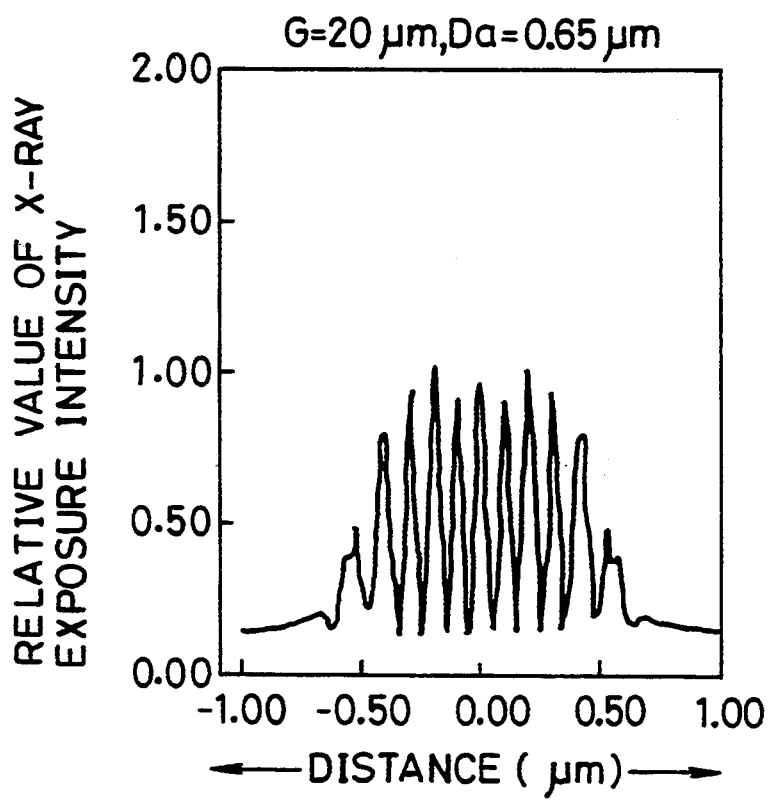
FIG. 6 is a diagram showing an X-ray exposure intensity distribution on a sample using the conventional X-ray exposure mask shown in FIG. 5.
Figure 7:
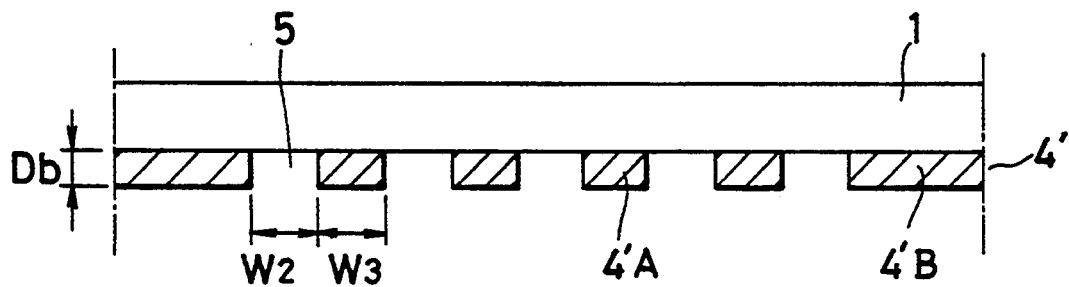
FIG. 7 is a schematic cross-sectional view showing a conventional X-ray exposure mask.
Figure 8:
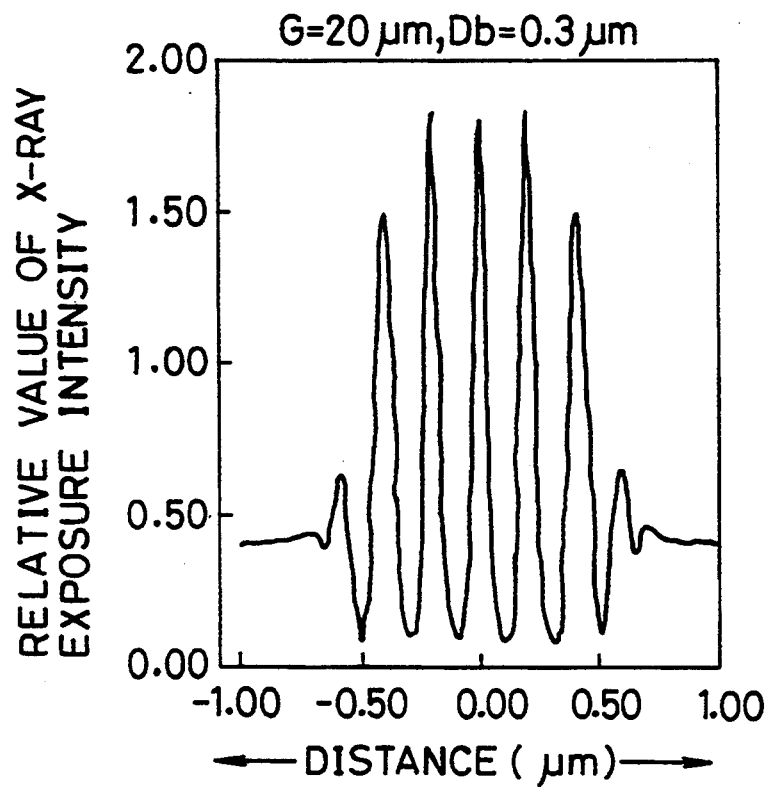
FIG. 8 is a diagram showing an X-ray exposure intensity distribution on a sample using the conventional X-ray exposure mask shown in FIG. 7.
Figure 9:
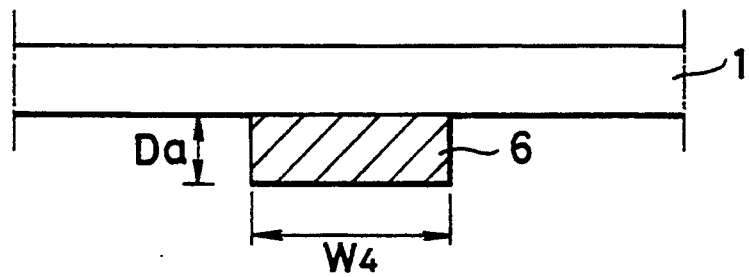
FIG. 9 is a schematic cross-sectional view showing a conventional X-ray exposure mask.
Figure 10:
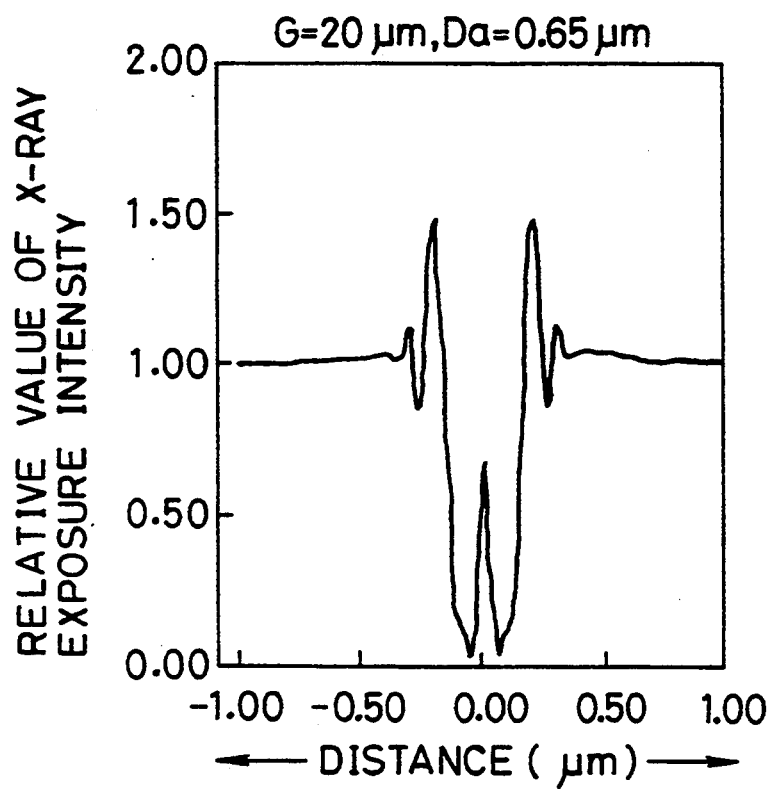
FIG. 10 is a diagram showing an X-ray exposure intensity distribution on a sample using the conventional X-ray exposure mask shown in FIG.9.
Figure 11:
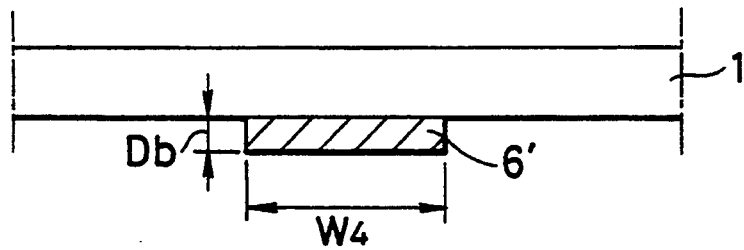
FIG. 11 is a schematic cross-sectional view showing a conventional X-ray exposure mask.
Figure 12:
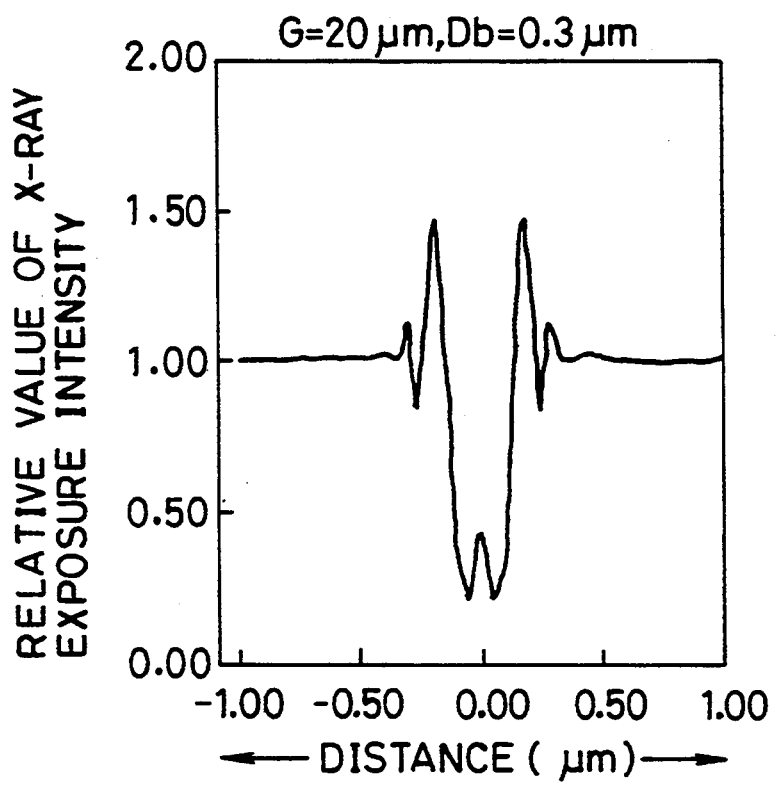
FIG. 12 is a diagram showing an X-ray exposure intensity distribution on a sample using the conventional X-ray exposure mask shown in FIG. 11.
Figure 13:
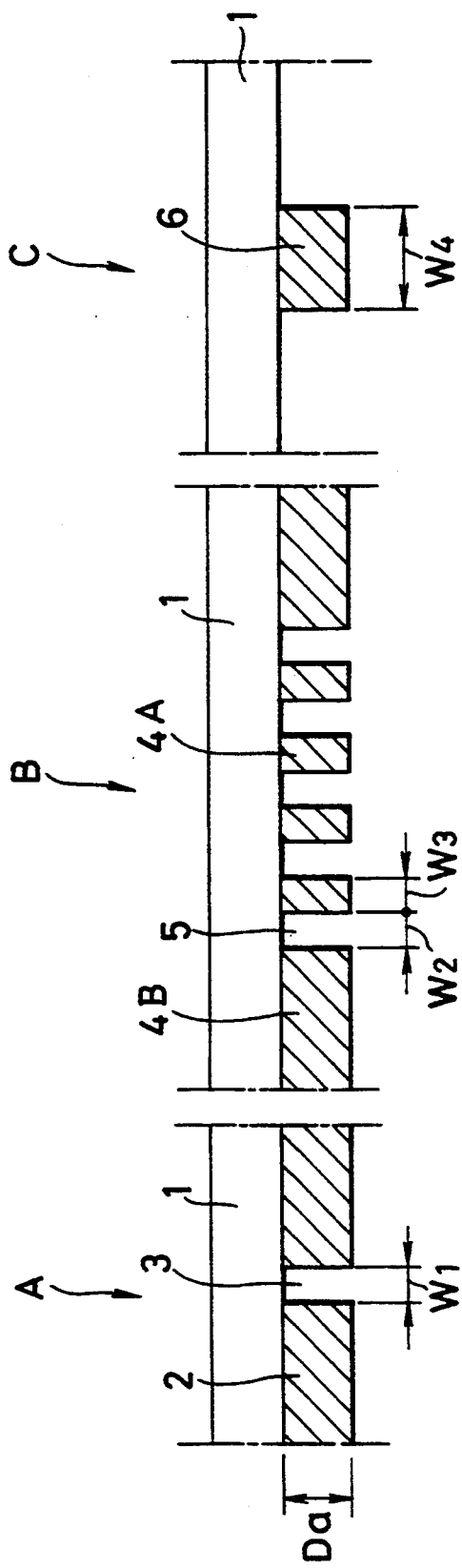
FIG. 13 is a schematic cross-sectional view showing another conventional X-ray exposure mask.
Figure 14:
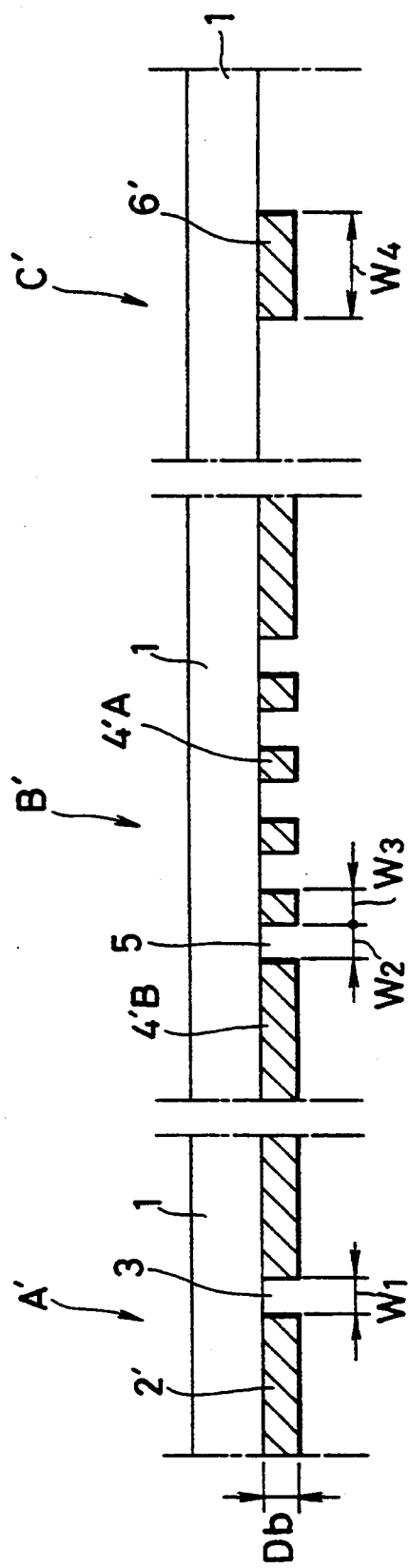
FIG. 14 is a schematic cross-sectional view showing yet another conventional X-ray exposure mask.
Figure 15:
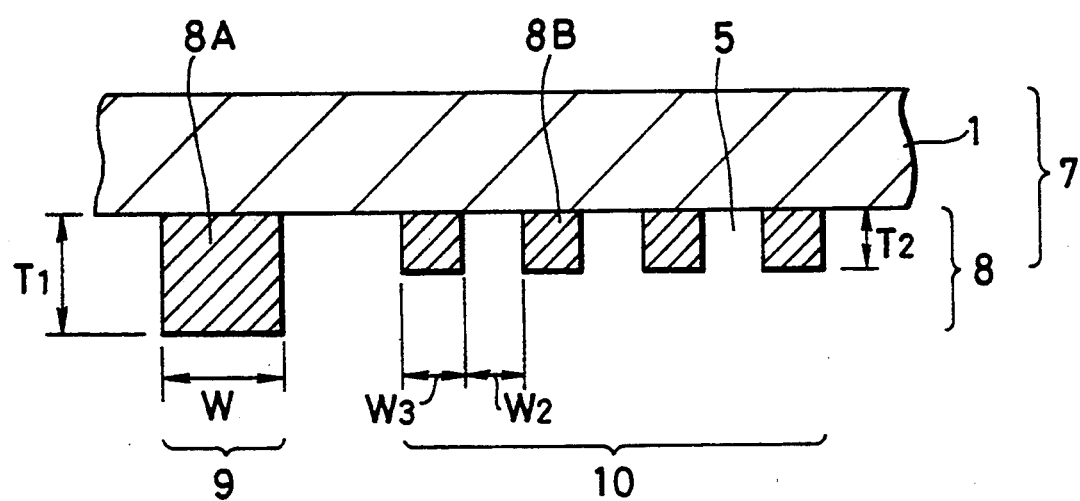
FIG. 15 is a schematic cross-sectional view showing the first embodiment of the present invention.

In FIG. 15, a cross-sectional view of the first embodiment of the X-ray exposure mask of the present invention is shown. The X-ray exposure mask 7 has major components including an X-ray transmission layer (membrane) 1 and an X-ray absorption layer 8 fabricated on the membrane 1. In this embodiment, two kinds of X-ray absorber patterns having different plane sizes are formed, that is, a pattern 9 having a single absorber 8A with relatively large plane width and a pattern 10 including absorbers 8B with small pules size and windows 5. Absorbers 8B and windows 5 are so arranged that their interval is maintained to be constant in a repetitive manner. This embodiment shown in FIG. 15 improves the prior art shown in FIG. 5 and FIG. 7.

The absorber 8 is composed of tantalum (Ta) and the membrane 1 is composed of silicon nitride (SiN) and its thickness is 2 $\mu$m. The width W of the absorber 8A is 1 $\mu$m, the width W3 of the absorber 8B is 0.2 $\mu$m and its adjacent window width W2 is also 0.2 $\mu$m. The thicknesses T1 and T2 of absorbers 8A and 8B corresponding to each of the patterns 9 and 10 are 0.65 $\mu$m and 0.3 $\mu$m, respectively.

The X-ray exposure mask shown in FIG. 15 was fabricated in the following steps. At first, after forming a 2 $\mu$m thick silicon nitride layer on the both surfaces of the silicon substrate by CVD (Chemical Vapor Deposition), a tantalum layer with a thickness of 0.65 $\mu$m was formed on the silicon nitride layer on one surface of the substrate and furthermore, a silicon dioxide layer with thickness of 0.3 $\mu$m was formed on the tantalum layer by ECR (Electron Cyclotron Resonance). An EB (Electron Beam) resist was coated on the silicon dioxide layer, and the resist material was exposed by the electron beam and developed to remove the resist except on the absorbers 8A. Using this resist pattern as an etching mask, the silicon dioxide layer was etched by RIE (Reactive Ion Etching). And furthermore, using the etched silicon dioxide layer as an etching mask, the 0.65 $\mu$m thick tantalum layer is etched until the thickness of the tantalum layer gets to 0.3 $\mu$m by RIE. The silicon dioxide layer was removed with thin hydrofluoric acid (HF) solution and a 0.3 $\mu$m-thick silicon dioxide layer was again formed on the substrate by ECR. EB resist was coated on the silicon dioxide layer and the resist was exposed by electron beam and developed to remove it except on the absorbers 8A and 8B. This exposed resist pattern was used as an etching mask in order to remove the silicon dioxide layer by RIE etching. And furthermore, using the etched silicon dioxide layer as an etching mask, the 0.3 $\mu$m-thick tantalum layer was etched by RIE except for the absorber patterns 8A and 8B. Finally, the silicon nitride layer on the backside of the silicon substrate except its edge parts was removed by etching processing, and the remaining silicon nitride layer was used as an etching mask in order to remove the silicon substrate by wet etching processing. As the thickness of the tantalum layer used for forming the absorber pattern 10 in the exposure mask of this embodiment is so small as 0.3 μm, the etching performance is good, problems in prior art such as broken patterns and irregular pattern edge shapes can be eliminated, and furthermore, the pattern shape and size can be regulated precisely in fabricating process in spite of using such a narrow pattern width as 0.2 μm.

Using the above described X-ray exposure mask 7, pattern replication processing is performed in an X-ray exposure apparatus using synchrotron radiation having a peak wavelength of 0.8 nm. The gap between the mask and the wafer is controlled to be 30 μm. Positive resist FBM-G (made by Daikin Co. Ltd.) with thickness of 1 μm was coated as exposure resist. In case of using the X-ray exposure mask of this embodiment, the optimal exposure dose to control the deviation of the resist pattern size corresponding to the absorber pattern 10 within ±10% of 0.2 μm was 100±20 mJ/cm$^2$ and the large exposure dose margin could be obtained to be ±20%. With respect to the absorber pattern 9, the deviation of the resist patterns size corresponding to the pattern 9 could be controlled within ±10% with the exposure dose between 80 and 160 mJ/cm$^2$. In contrast, in case of using conventional exposure masks, the optimal exposure dose to control the deviation of the resist pattern size corresponding to the absorber pattern 10 within ±10% was 150 ±15 mJ/cm$^2$ where the exposure dose margin was reduced to be less than half of the margin given by the present invention. With respect to the absorber pattern 9, in using the dose of 150 mJ/cm$^2$, the size of the replicated pattern was reduced by 10% from the design value 1 μm, and so, the absorber patterns 9 and 10 could not be replicated exactly at the same time in accordance with the designed value. In addition, in case of using the X-ray exposure mask of the present invention, the necessary exposure dose for replicating patterns was so small as 100 mJ/cm$^2$, and in contrast, in case of using conventional exposure masks, the exposure intensity was required to be as large as 150 mJ/cm$^2$. As a result, in using the X-ray exposure mask of the present invention, the exposure time could be reduced by ⅔ and the throughput could be attained to be 1.5 times as large as that in using conventional exposure masks.

Figure 16:
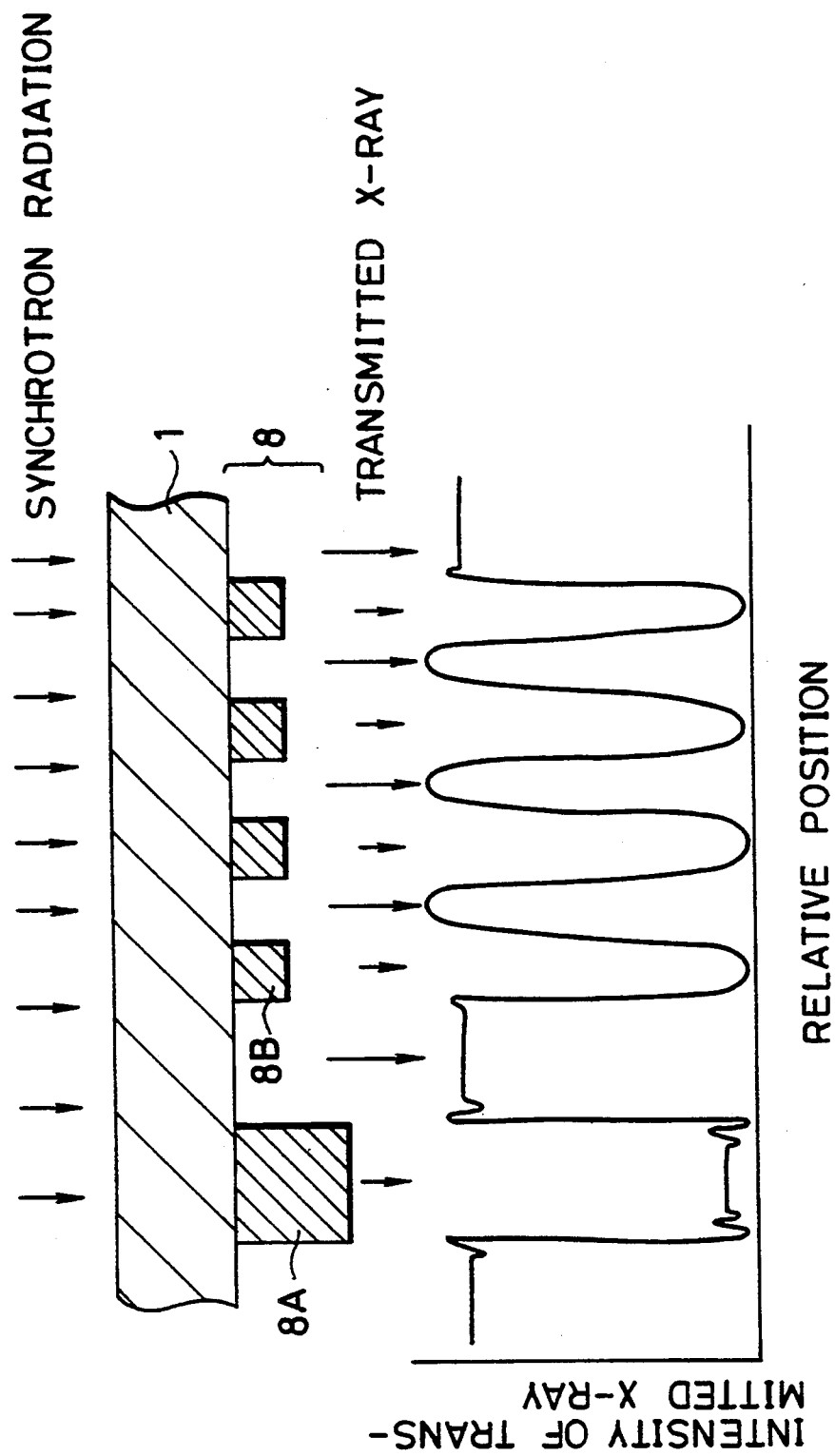
FIG. 16 is a diagram showing the transmitted X-ray intensity in case of using the X-ray mask of the first embodiment of the present invention.
Figure 17:
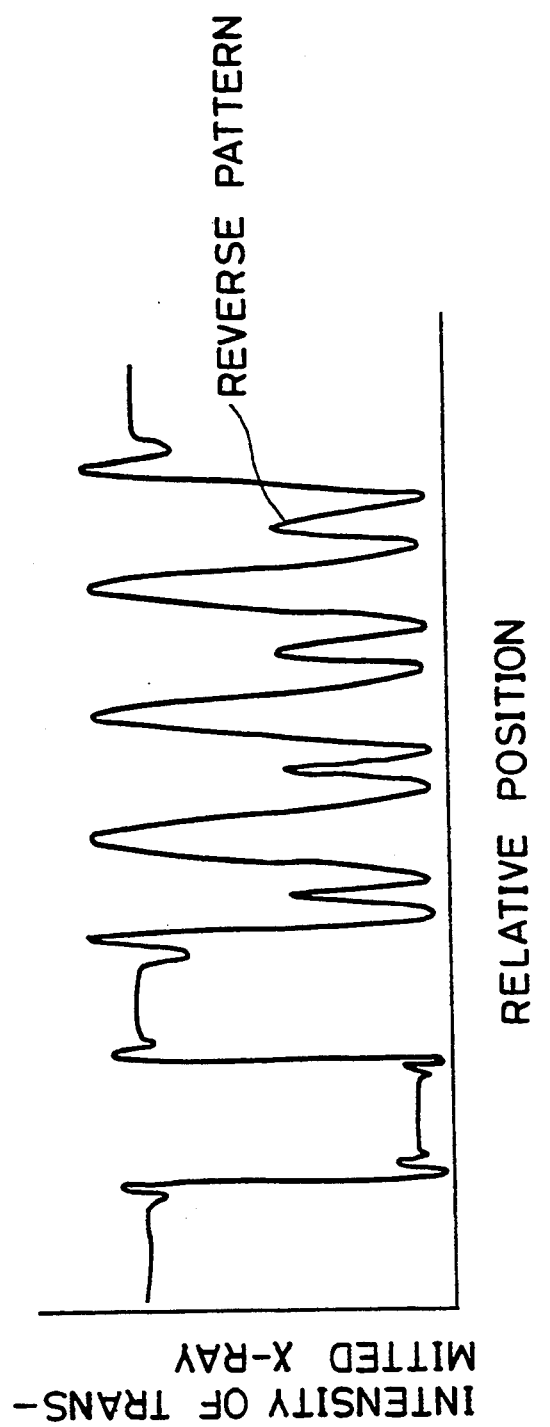
FIG. 17 is a diagram showing the transmitted X-ray intensity when using a conventional X-ray mask.

The reason why the higher pattern transfer performance can be obtained by the X-ray exposure mask of the present invention is described below. In FIG. 16, the transmitted X-ray exposure intensity distribution is shown when using the X-ray exposure mask of the present invention. In FIG. 17, the transmitted X-ray exposure intensity distribution is shown when using the conventional X-ray exposure mask. The X-ray transmitted through the membrane diffracts in response to the proximity gap of 30 μm. The phase of the X-ray transmitted through the absorption layer shifts and the intensity of the X-ray is reduced. In addition, the X-rays transmitted through the absorption layer and the membrane interfere each other. The region where the diffraction and the interference occur is determined by the X-ray wavelength and the proximity gap, and in case of using the X-ray wavelength and the proximity gap in this embodiment, the region where the diffraction and the interference show a highest effect is extended at most 0.2 μm from the pattern edge. Hence, the smaller the pattern size, the larger the effect of diffraction and interference which leads to the deviation of the transmitted X-ray intensity distribution. By using these characteristics and by determining optimally the thickness of the absorption layer with respect to the fine pattern region to obtain the optimum X-ray intensity distribution, an effective exposure contrast for fine absorber patterns can be improved. That is, in this embodiment, by making the absorber thickness of fine lines-and-spaces patterns of 0.2 μm small enough to be 0.3 μm, the effective contrast can be increased. The transmitted X-ray intensity distribution with respect to lines-and-spaces pattern shown in FIG. 16 will be described in detail later. While, where the thickness of the absorption layer including large-sized, for example 1 μm-width patterns are made as thin as 0.3 μm, the X-ray intensity distribution within 0.2 μm from the edge attained is good, but since the X-ray intensity distribution further inside is influenced by the mask contrast as described above, the intensity of the transmitted X-ray is increased because of the low contrast. As a result, the fog occurs on the resist pattern. In case of making the thickness of the absorption layer including both the large-sized patterns and the fine patterns 0.65 μm which is used in prior art, the X-ray intensity distribution in the region corresponding to the large-sized patterns obtained is good, but as shown in FIG. 17, the X-ray intensity distributes in reverse mode in the region of 0.2 μm fine patterns or has unfavorable peaks in the region within pattern. Owing to this, the exposure dose margin becomes smaller which leads to the deterioration of the pattern replication performance. In order to replicate precisely both of the large-sized patterns and the fine patterns, this embodiment of the present invention is effective where the thickness of the absorption layer corresponding to the large-sized patterns is controlled to be equivalent to that of prior art and only the thickness of the absorption layer corresponding to the fine patterns is taken to be small. In other words, it is proved to be valid to give such an intensity distribution so that the peaks of the distribution may correspond to the regions without X-ray absorbers and the bottoms of the distribution may correspond to the regions with absorbers, in which the intensity distribution is defined in the direction along the horizontal line on FIG. 16, that is, the direction parallel to the direction along which the width of absorber is defined.

As a second example the X-ray exposure mask having lines-and-spaces patterns with W3 and W2 shown in FIG. 15 being 0.15 μm, respectively, is fabricated in the following manner. The thickness T2 of the absorption layer 10 is controlled to be 0.3 μm so that the phase shift defined by |360 (1−n)T2/λ| may be 83° and the mask contrast defined by 1/exp(−μT2) may be 2.45 with respect to the synchrotron radiation having a peak power wavelength of 0.8 nm. In this configuration, the refractive index n of tantalum is 0.99939 and the linear absorption coefficient μ is 0.002987 (nm$^{-1}$). This mask is fabricated by the same process as that for the mask shown in FIG. 15. In the fabricating process, there are no problems such as broken patterns and irregular pattern edge shapes, and desired fine patterns having small-sized shape such as 0.15 μm are formed precisely.

Figure 18:
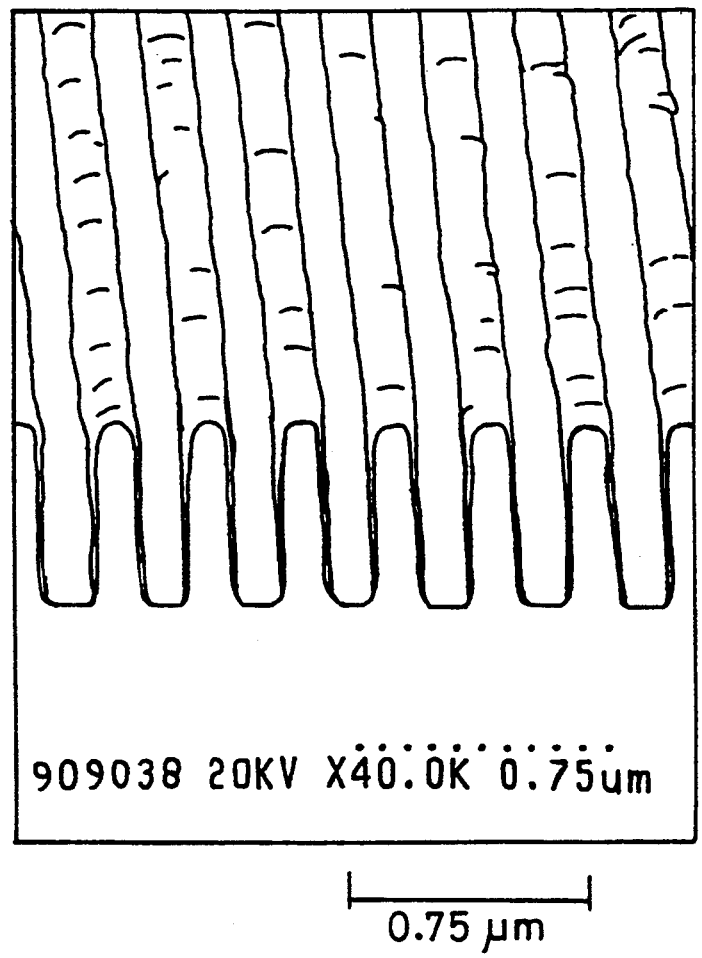
FIG. 18 is a scanning electron microscopic photograph showing a resist pattern formed by using the X-ray mask of the present invention.

Using the X-ray exposure mask including lines-and-spaces patterns fabricated by the above mentioned process, patterns are transferred with an X-ray exposure apparatus using synchrotron radiations having a peak power wavelength of 0.8 nm. The gap between the mask and the wafer is controlled to be 30 μm. A positive resist FBM-G is coated to a thickness of 0.6 μm on the wafer and patterns are replicated. An example of scanning electron microphotograph of the replicated resist pattern is shown in FIG. 18. In case of using this mask, the range of the X-ray exposure dose can be taken to be large enough from 80 to 110 mJ/cm$^2$.

Figure 19:
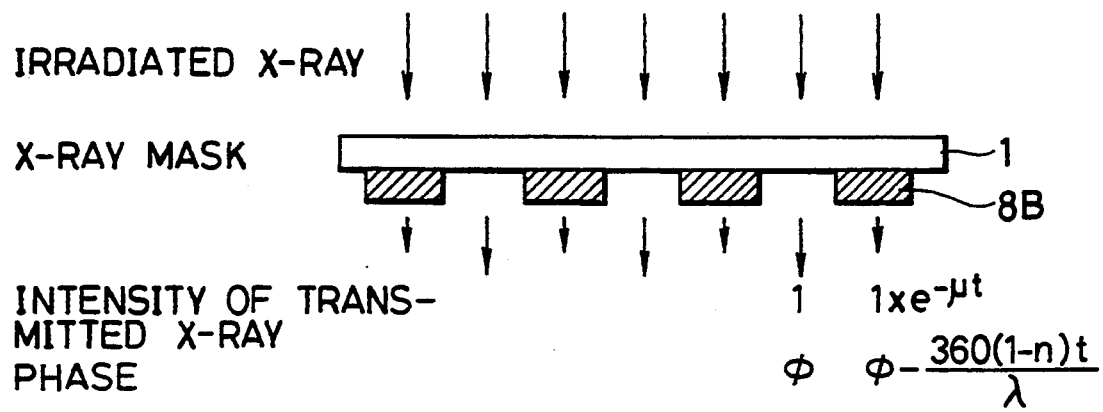
FIG. 19 is a diagram for explaining the intensity and the phase of the transmitted X-ray.
Figure 20:
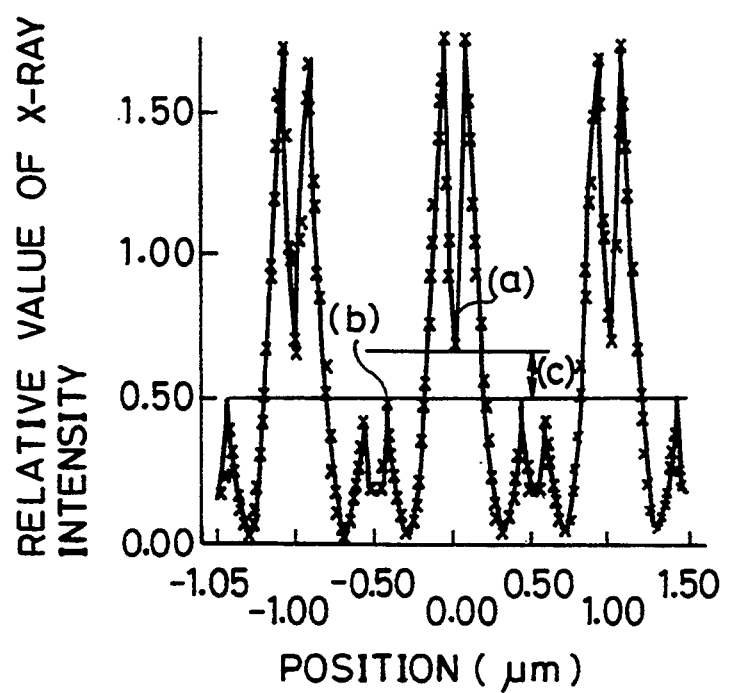
FIG. 20 is a diagram showing a general example of the transmitted X-ray intensity distribution with respect to the X-ray transmission through the X-ray mask in X-ray exposure.

The reason why the higher pattern transfer performance can be obtained by the X-ray exposure mask of the present invention is described below. In FIG. 19, a cross-sectional view of the X-ray mask and the intensity and the phase of the transmitted X-ray are shown. In FIG. 20, a general example of the transmitted X-ray intensity distribution is shown. In FIGS. 19 and 20, the X-ray intensity is normalized by the X-ray intensity transmitted through the membrane without absorber patterns. The X-ray transmitted through the membrane diffracts at the absorber edge in response to the proximity gap of 30 $\mu$m. The intensity of the X-ray transmitted through the absorber pattern is reduced by $\{1-\exp(-\mu t)\}$ and the phase of the X-ray is shifted by $\{360(1-n)t/\lambda\}$ degrees, wherein t is a thickness of the absorber. In addition, the X-ray transmitted through the absorber and membrane interfere with each other. The region where the diffraction and the interference occur is determined by the X-ray wavelength and the proximity gap, and in case of the X-ray wavelength and the proximity gap in this embodiment, the region where the diffraction and the interference occur significantly is extended at most 0.2 $\mu$m from the pattern edge. Hence, the smaller the pattern size, the larger the effect of diffraction and interference which leads to the deviation of the transmitted X-ray intensity distribution. In some cases, the X-ray intensity distribution shows a reverse intensity pattern as (a) and (b) shown in FIG. 20, which leads to the inability to replicate resist patterns exactly in accordance with the mask patterns. However, when the phase shift and the decrease of X-ray intensity is controlled optimally in accordance with the present invention, the effect of the X-ray diffraction and interference can be effectively used to obtain an optimum X-ray intensity distribution for replicating exactly the mask patterns.

That is, the minimum value of the X-ray intensity at the position (a) in FIG. 20 can be increased, the maximum value of the X-ray intensity at the position (b) in FIG. 20 can be decreased, and as a result, the difference (c) between them can be increased. Owing to this configuration, it will be appreciated that the effective exposure contrast can be increased even with respect to fine patterns less than 0.3 $\mu$m. In the case that the region where the X-ray intensity distribution can exactly capture the mask pattern is defined by the exposure dose margin M and that the minimum value at (a) is assumed to be a and the minimum value at (b) is assumed to be b, then the following relationships can be established;
 (i) M=a/b if a is less than 1, and
 (ii) M=1/b if a is equal to or greater than 1.

Figure 21A:
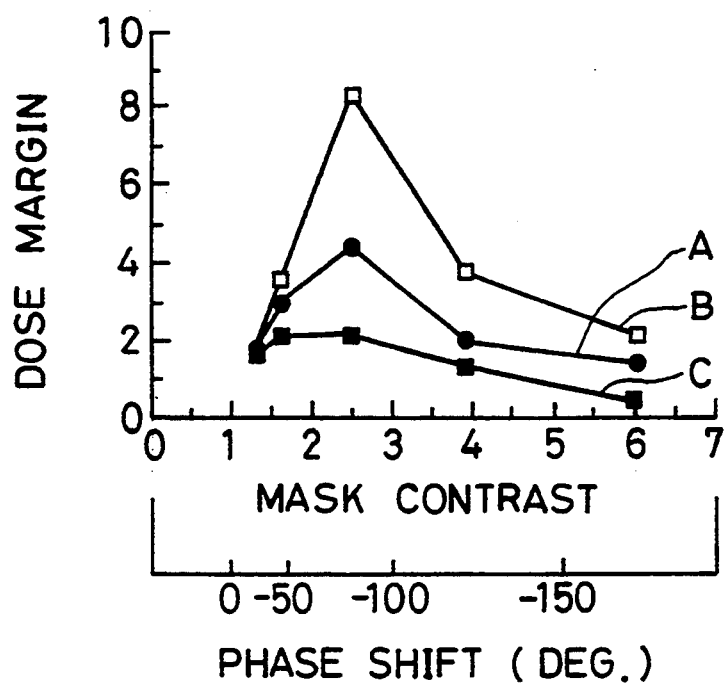
FIGS. 21A and 21B are diagrams showing the dependence of the exposure dose margin on the mask contrast and the phase shift, respectively.
Figure 21B:
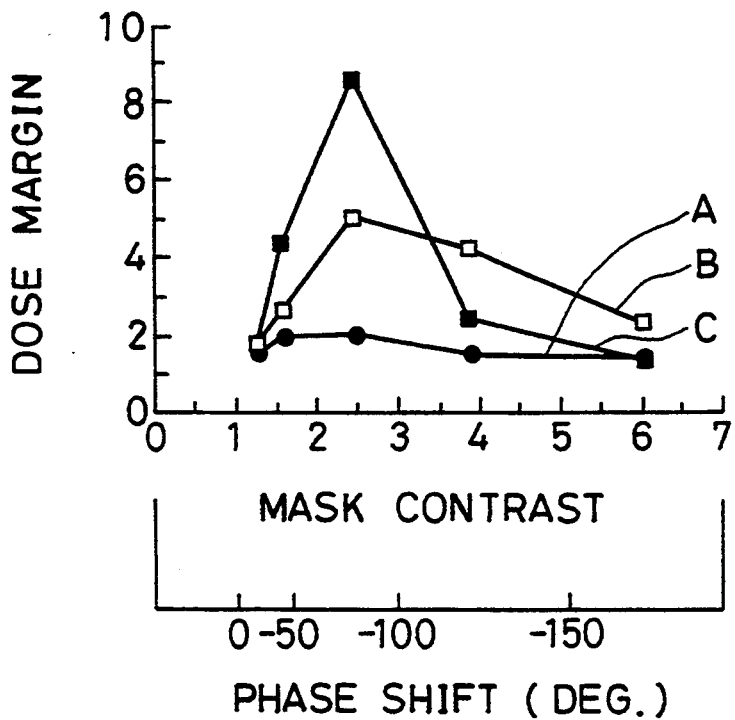

In FIGS. 21A and 21B, the relationship between the exposure dose margin and the mask contrast and the relationship between the exposure dose margin and the phase shift are shown. As for FIG. 21A, the proximity gap is 30 $\mu$m, and as for FIG. 21B, the proximity gap is 20 $\mu$m. In FIGS. 21A and 21B, curves A, B and C correspond to the line width and the space width, 0.2 $\mu$m, 0.15 $\mu$m and 0.1 $\mu$m, respectively. As found in FIGS. 21A and 21B, the exposure dose margin has the maximum value when the mask contrast is about 2.5 and the phase shift is about 80° and the exposure dose margin has relatively high values where the mask contrast is between 1 and 4, and the phase shift within a range from 30° to 120°. Hence, by controlling the thickness of the absorber so that these conditions may be satisfied, fine patterns including the lines-and-spaces patterns of 0.1 $\mu$m to 0.2 $\mu$m can be replicated exactly even if the proximity gap is as large as 20 $\mu$m to 30 $\mu$m. In the case that the material used for the absorption layer is tantalum, the thickness of the absorber is within a range from 75 nm to 450 nm so that the above mentioned conditions may be satisfied.

Figure 22:
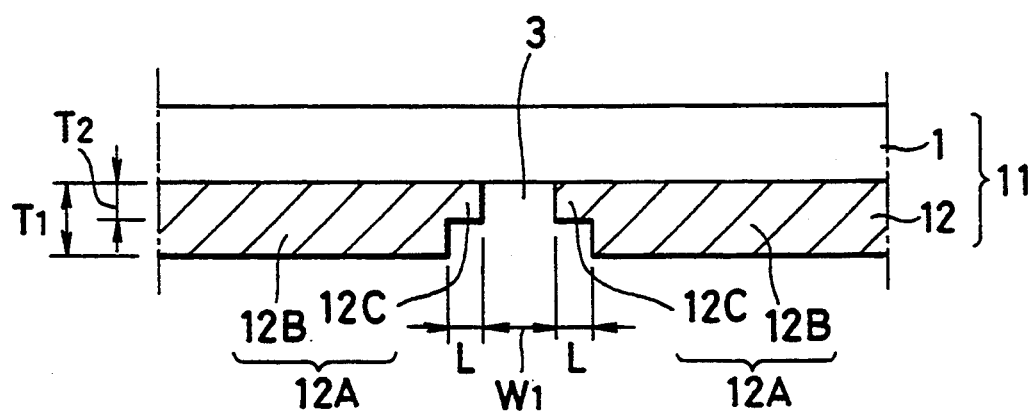
FIG. 22 is a schematic cross-sectional view showing the third embodiment of the present invention.

In FIG. 22, a cross-sectional view of the third embodiment of the X-ray exposure mask of the present invention is shown. The X-ray exposure mask 11 has major components including a 2 $\mu$m-thick X-ray transmission layer (membrane) 1 composed of silicon nitride and an X-ray absorption layer 12 which is formed on the membrane 1 and composed of tantalum. Specific patterns are formed in the X-ray absorption layer 12 so that a window 3 may be formed between a couple of the X-ray absorbers 12A. Absorber 12A is composed of the first part 12B with its thickness T1 and the second part 12C with its thickness T2 being less than T1. As an example, T1 is 0.65 $\mu$m and T2 is determined by considering the X-ray wavelength. As described before, T2 is 0.3 $\mu$m when the peak wavelength of the X-ray is 0.8 $\mu$m. The distance between a couple of the second parts 12C, that is, the width of the window 3 is 0.1 $\mu$m. The width L of the second part 12C is taken to be less than $Lq=1.2(G\lambda)^{\frac{1}{2}}$, where $\lambda$ is a peak wavelength and G is a proximity gap. Since the thickness of the second part 12C is less than the thickness of the first part 12B, the X-ray intensity transmitted through the second part 12C is greater than the X-ray intensity transmitted through the first part 12B, and the phase shift of the former X-ray is less than the phase shift of the latter X-ray.

Figure 23A:
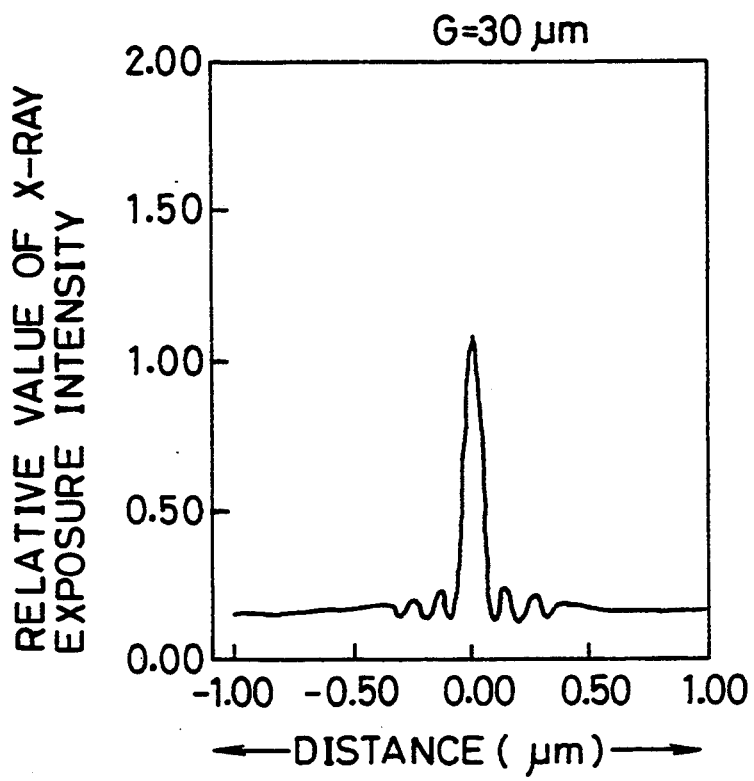
FIGS. 23A and 23B are diagrams showing an X-ray exposure intensity distribution on a sample using the X-ray exposure mask shown in FIG. 22.
Figure 23B:
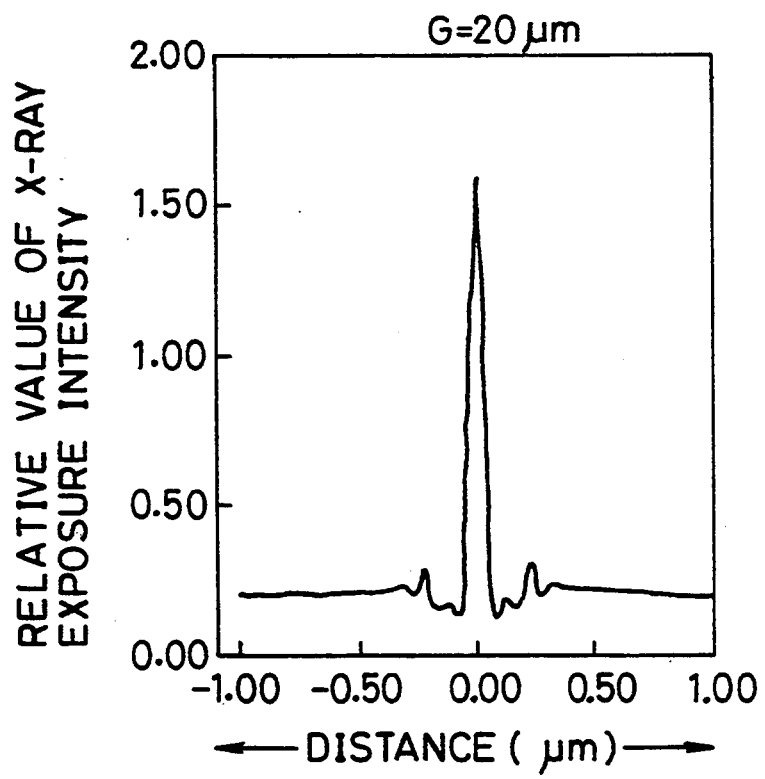

In FIGS. 23A and 23B, X-ray intensity distributions in the case of placing the mask shown in FIG. 22 on the sample with the proximity gap of 30 $\mu$m, respectively, and 20 $\mu$m and exposing the X-ray having the peak wavelength of 0.8 nm are shown. By controlling the phase shift of the X-ray transmitted through the X-ray absorber neighboring the window 3 and by restricting the mutual interference between the X-rays diffracted from the window 3 and the X-rays transmitted through the absorber, the high effective exposure contrast and the high exposure dose margin can be attained even if the width of the window 3 is as small as 0.1 $\mu$m. In addition, as the X-ray exposure intensity distribution captures exactly the mask patterns, the high precision mask pattern replication can be established.

Figure 24A:
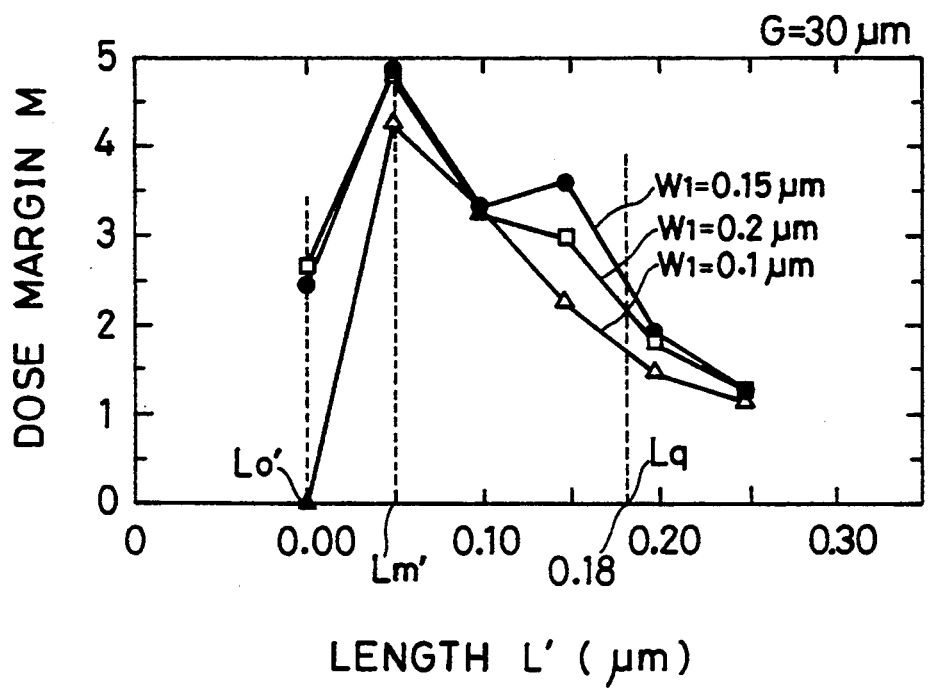
FIGS. 24A and 24B are diagrams showing the relationship between the exposure dose margin M and the width L of the X-ray absorber of the X-ray exposure mask shown in FIG. 22.
Figure 24B:
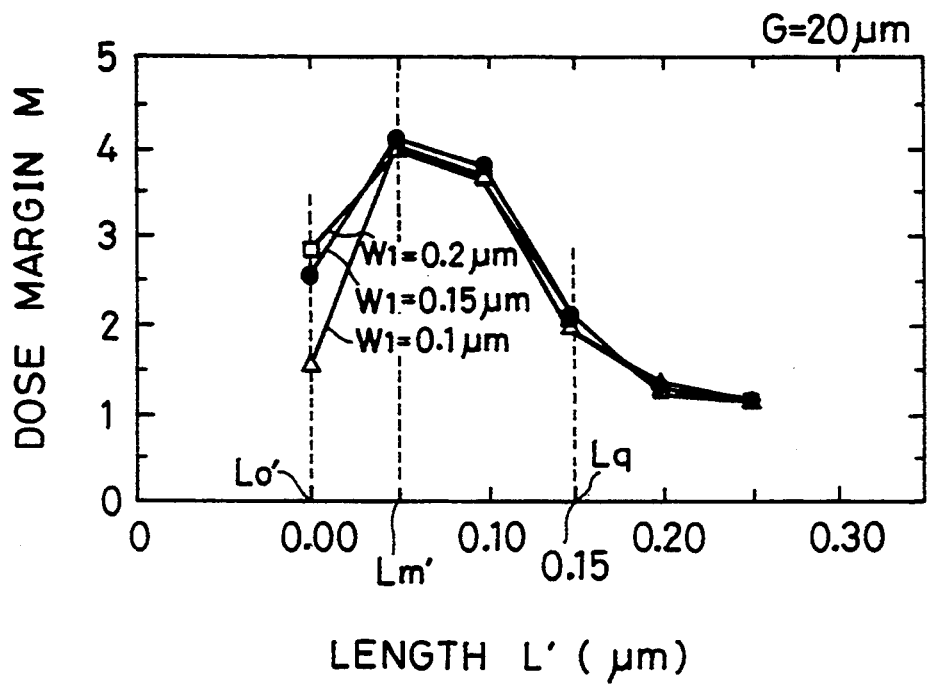

FIGS. 24A and 24B show dependence of the exposure dose margin M on the width L of the second part 12C, that is, the part having the thickness of 0.3 $\mu$m, with the width W1 of the window 3 as a parameter. As for FIG. 24A, the proximity gap G is 30 $\mu$m, and as for FIG. 24B, the proximity gap G is 20 $\mu$m. The exposure dose margin M increases as the width L increases from the starting point L0, that is L=0, and M reaches the maximum value when the width L gets to Lm, and M decreases as L increases beyond Lm. As shown in FIGS. 24A and 24B, the value of L to make the exposure dose margin M greater than 1.5 are 0.18 $\mu$m and 0.15 $\mu$m in the case that G are 30 $\mu$m and 20 $\mu$m, respectively.

In the above cases, the refractive index of the X-ray absorption layer 12 is 0.99939, the linear absorption coefficient is 0.002987(nm$^{-1}$), the relative X-ray transmittance at the second part 12C is 40% when the X-ray transmittance at the window 3 is defined to be 100%, and the phase shift is $-83°$ when the phase shift at the window 3 is defined to be $0°$.

That is, k is calculated to be 1.2 from the equation $Lq=k(G\lambda)^{\frac{1}{2}}$. In other words, to obtain the sufficient exposure dose margin, it is required to make the width L of the second part 12C satisfy the following equation; $L \leq 1.2 (G\lambda)^{\frac{1}{2}}$. Let G2 be the maximum X-ray exposure intensity at the sample position corresponding to the window 3, and let G3 be the maximum X-ray exposure intensity at the sample position corresponding to the X-ray absorber, both of which are normalized by the X-ray exposure intensity transmitted through the membrane, in this case if G2 is greater than or equal to 1, the exposure dose margin M is 1/G3, and if G2 is less than 1, M is G2/G3.

Figure 25:
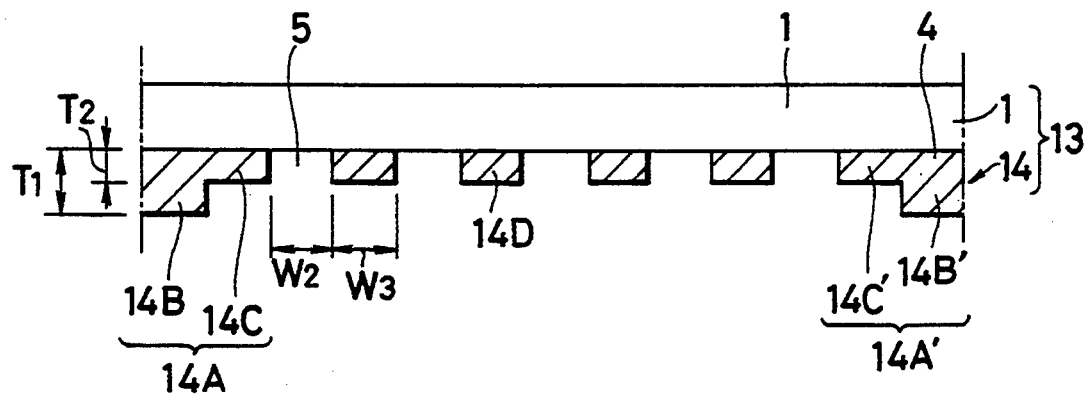
FIG. 25 is a schematic cross-sectional view showing the fourth embodiment of the present invention.

FIG. 25 is a cross-sectional view of the fourth embodiment of the X-ray exposure mask of the present invention. The X-ray absorption layer 14 in the mask 13 is formed to be lines-and-spaces patterns. Absorber 14A at both ends has the first part 14B with its thickness of T1 and the second part 14C with its thickness T2 being less than T1, and the thickness of the absorber 14D placed between both of 14A is T2. For example, T1 may be 0.65 $\mu$m, and T2 may be 0.3 $\mu$m in the case of using the X-ray with peak wavelength of 0.8 $\mu$m. The width of the second part 14C is less than or equal to $1.2(G\lambda)^{\frac{1}{2}}$ similarly to the embodiment shown in FIG. 22. The distance between the absorbers 14A and 14D, and the distance between a couple of absorbers 14D, that is, the width W2 of the window 5 and the width W3 of the absorber 14D are 0.1 $\mu$m, respectively.

Figure 26:
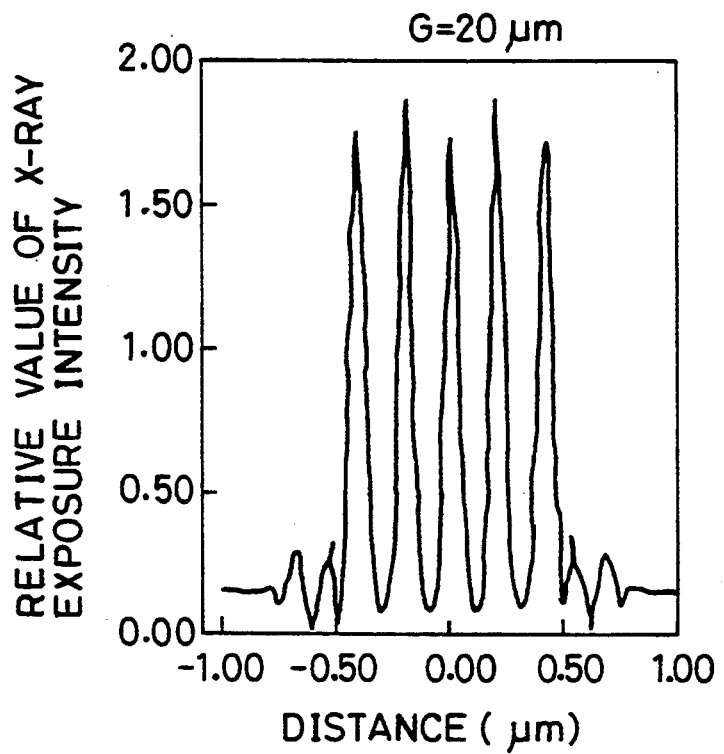
FIG. 26 is a diagram showing an X-ray exposure intensity distribution on a sample using the X-ray exposure mask shown in FIG. 25.

FIG. 26 shows the X-ray exposure intensity distribution on the sample in the case where the mask 13 is placed on the sample with the proximity gap of 20 $\mu$m and where the peak wavelength of the X-ray is 0.8 $\mu$m. Since each of the absorber 14A is controlled to be two different thicknesses and the thickness of absorber 14D has also controlled, the higher exposure contrast and the higher exposure dose margin can be attained because of the similar reason explained in the second and third embodiments. In addition, there is no fog at the periphery of the mask pattern and the pattern defined by the absorber can be replicated precisely.

Figure 27:
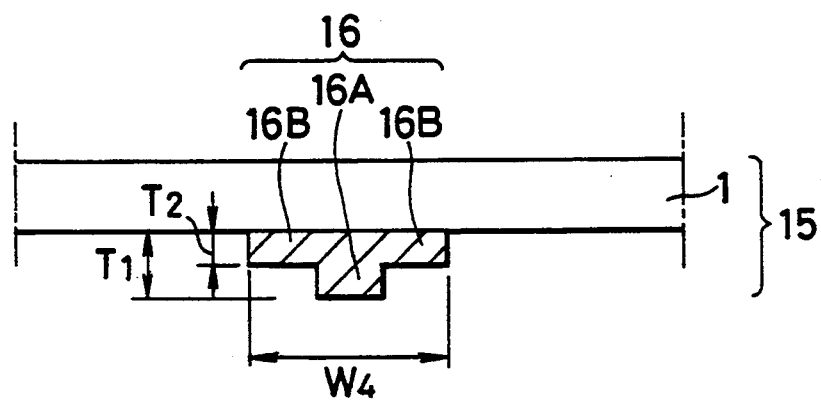
FIG. 27 is a schematic cross-sectional view showing the fifth embodiment of the present invention.

FIG. 27 shows a cross-sectional view of the fifth embodiment of the X-ray exposure mask of the present invention. The material used for the absorption layer 16 in the mask 15 is tantalum and the width W4 of the absorber 16 is 0.2 $\mu$m. The absorber 16 is composed of the first part 16A with the thickness T1 at its center and of the second parts 16B with the thickness T2 being less than T1 at the both end parts of the absorber 16. T1 and T2 are 0.65 $\mu$m and 0.3 $\mu$m, respectively, and the width of the second part 16B is less than $1.2(G\lambda)^{\frac{1}{2}}$.

Figure 28:
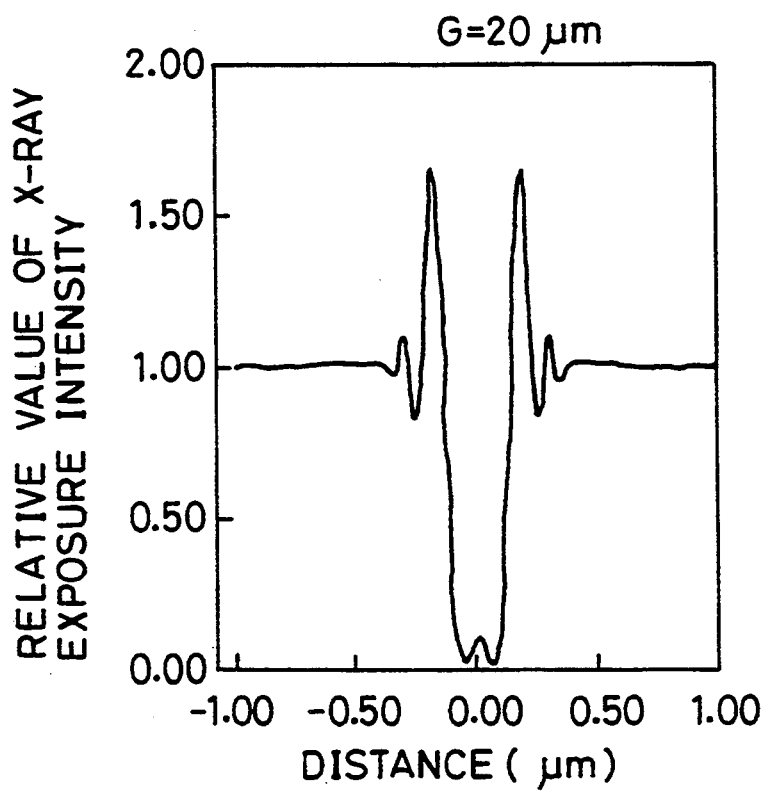
FIG. 28 is a diagram showing an X-ray exposure intensity distribution on a sample using the X-ray exposure mask shown in FIG. 27.

FIG. 28, shows the X-ray exposure intensity distribution in the case of placing the mask 15 on the sample with the proximity gap of 20 $\mu$m and using the X-rays having the peak wavelength of 0.8 $\mu$m. In this embodiment, the higher exposure contrast and the higher exposure dose margin can be attained, and the pattern defined by the absorber can be replicated precisely onto the sample.

Figure 29:
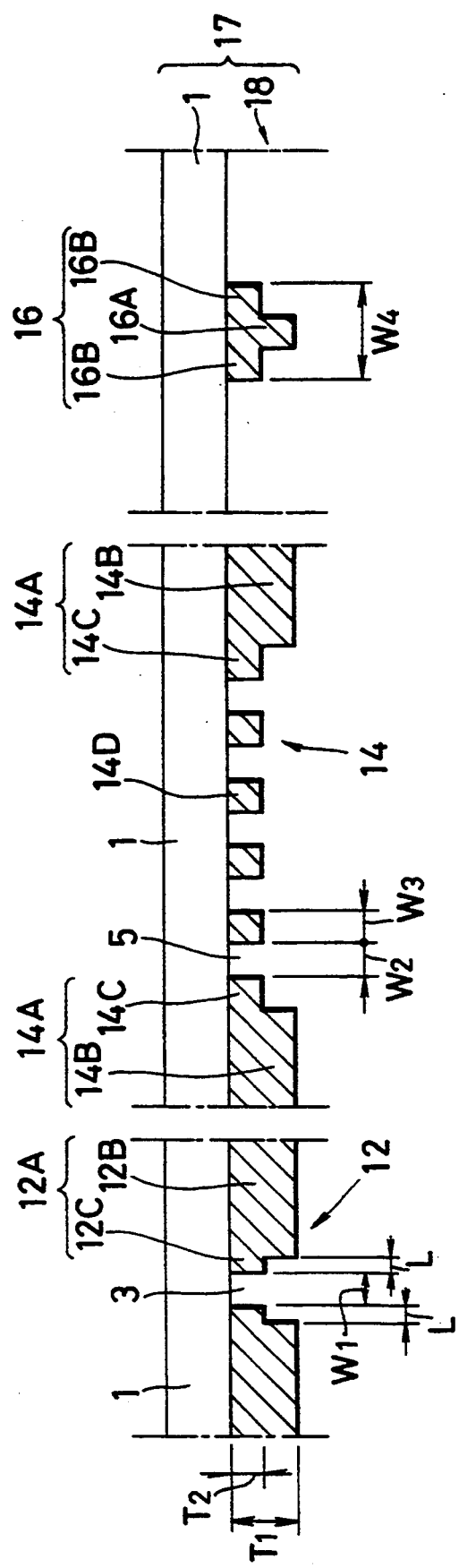
FIG. 29 is a schematic cross-sectional view showing the sixth embodiment of the present invention.

FIG. 29 shows the cross-sectional view of the sixth embodiment of the X-ray exposure mask of the present invention. The X-ray absorption layer 18 of the mask 17 contains patterns 12, 14 and 16 shown in FIGS. 22, 25 and 27. Used materials and thickness of the X-ray transmission layer 1 and the absorption layer 18 are similar to those used in the previously described embodiments.

Therefore, the mask 17 brings an overall effect summing up an individual effect given by each mask defined in the previously described embodiments.

Next, by referring to FIGS. 30A through 30K, the fabricating process of the mask shown in FIG. 29 is described.

Figure 30A:
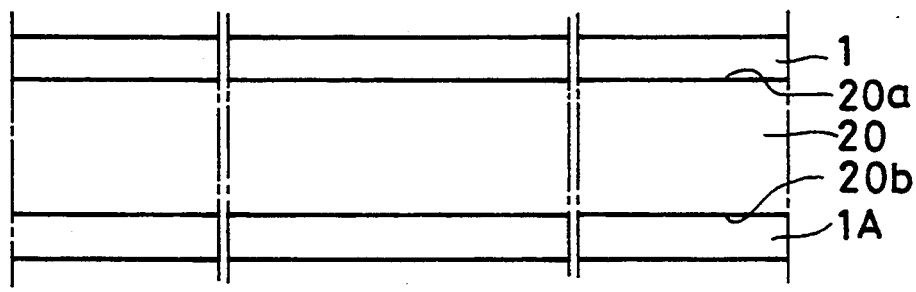
FIGS. 30A to 30K are cross-sectional views showing process steps in an embodiment of fabricating the X-ray exposure mask of the present invention.

At first, the X-ray transmission layer 1, for example, made of silicon nitride is formed on the main surface 20a of the substrate 20, for example, made of silicon, and the silicon nitride layer 1A is formed on another main surface 20b behind the main surface 20a of the substrate 20 by known low pressure CVD method, the thicknesses of which are 2 $\mu$m respectively, (FIG. 30A).

Figure 30B:
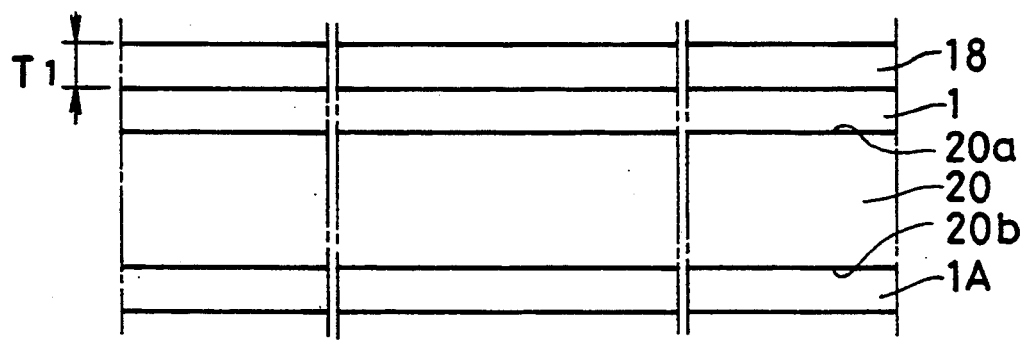

Next, the X-ray absorption layer 18 which is, for example, composed of tantalum and is used to form X-ray absorbers 12, 14 and 16 of X-ray exposure masks, is formed on the X-ray transmission layer 1, for example, by known magnetron sputtering deposition method and has the thickness of 0.65 $\mu$m (FIG. 30B).

Figure 30C:
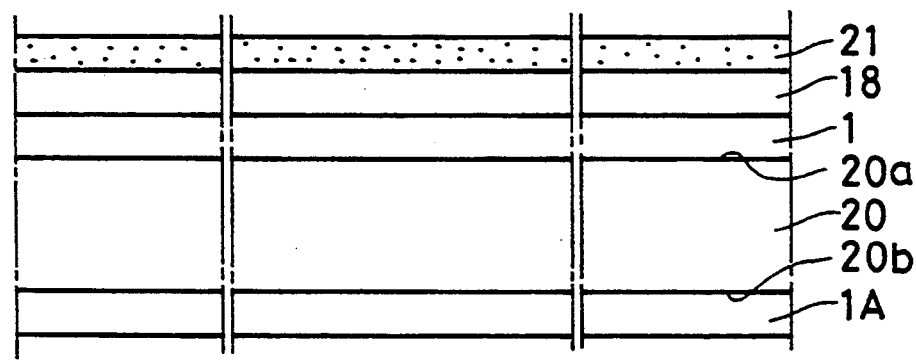

Next, the mask material layer 21 for absorber etching, for example, made of Si02 and being 0.3 $\mu$m-thick, is formed on the X-ray absorption layer 18 by deposition method using a known electron cyclotron resonance apparatus (FIG. 30C).

Figure 30D:
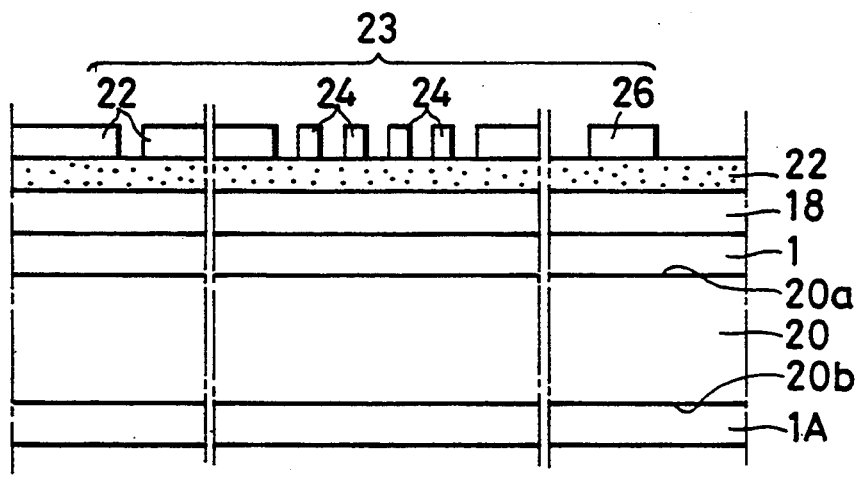

Next, the mask layer 23 for etching of the layer 21, for example, made of photo resist, is formed on the mask layer 21 and exposed in specific patterns shown by 22, 24 and 26 by known lithographic method. Patterns 22, 24 and 26 correspond to plane geometry of the absorber patterns 12, 14 and 16, respectively, defined on the X-ray absorption layer shown in FIG. 29 (FIG. 30D).

Figure 30E:
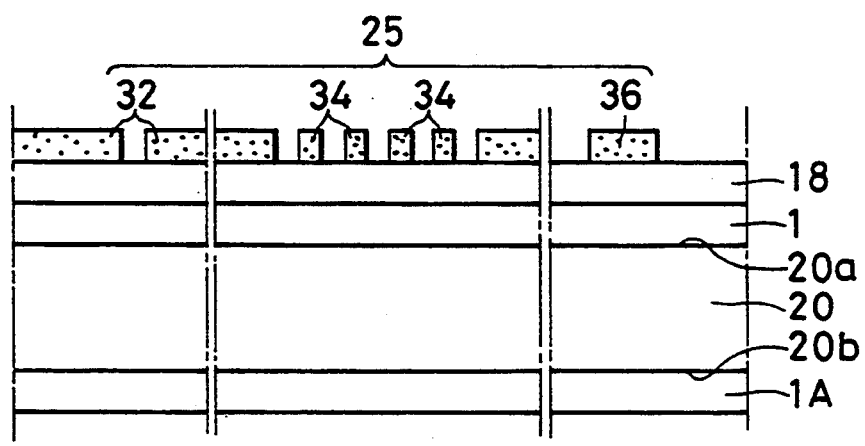

Next, using the mask layer 23 shaped in specific patterns as a mask, the mask material layer 21 is etched by known unisotropic etching method and after that, the mask layer 23 is removed. Thus, specific patterns as shown by 32, 34 and 36 are formed as a mask layer 25 (FIG. 30E).

Figure 30F:
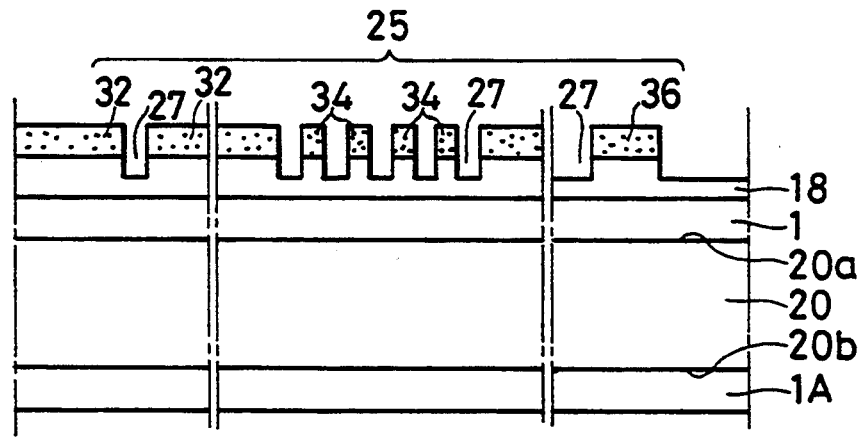

Next, using the mask 25 as a mask, the X-ray absorption layer 18 is etched by unisotropic etching method and channels 27 are formed. The depth of the channel 27 is so determined that the thickness of the X-ray absorption layer 18 below the bottom of the channel 27 may be less than or equal to T2 which was defined before (FIG. 30F).

Figure 30G:
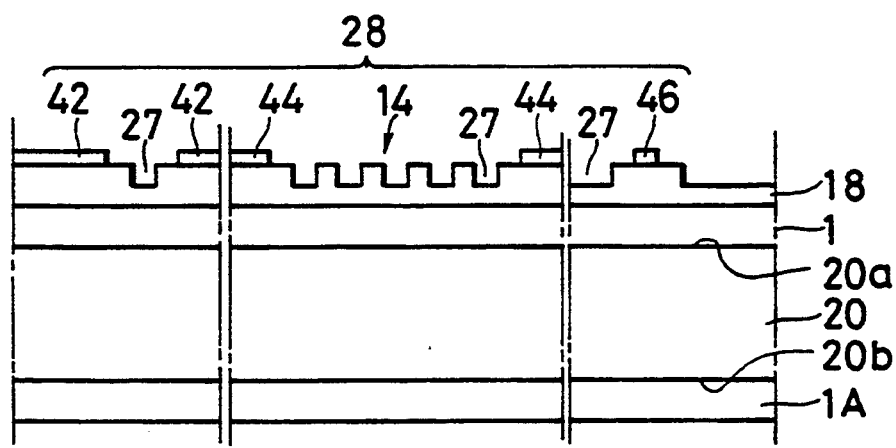
Figure 31:
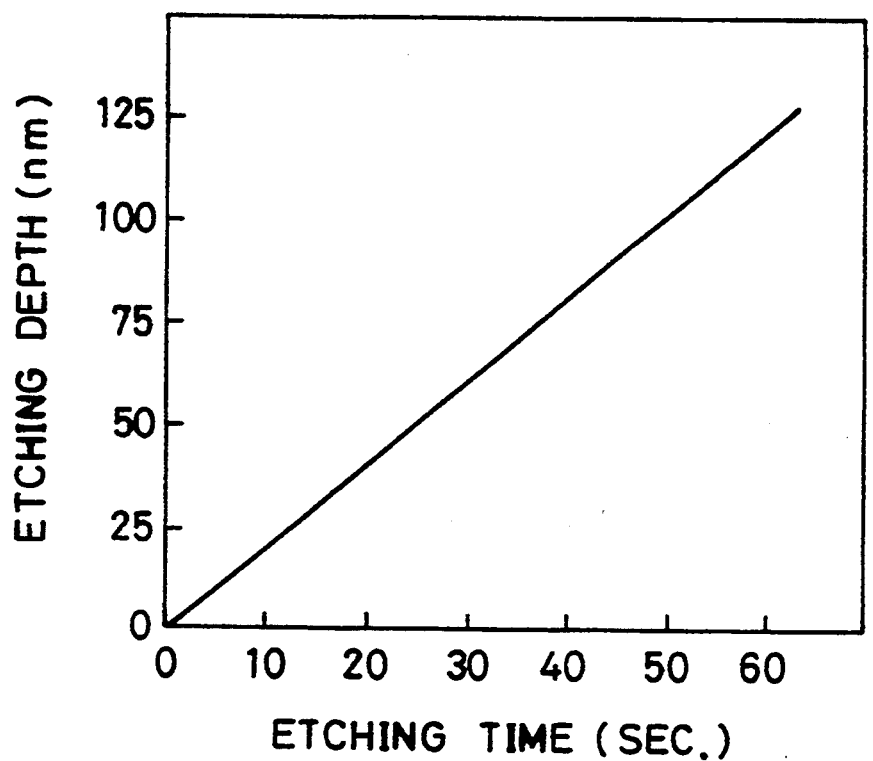
FIG. 31 is a diagram showing a relationship between the etching depth and the etching time period in the etching process of the mask layer shown in FIG. 30G.

Next, the mask layer 25 is etched by known isotropic etching method. That is, the mask layer 28 having mask layer members 42, 44 and 46, the shape of which corresponds to the plane geometry of the thick absorber parts 12B, 14B and 16A, respectively, as shown in FIG. 29 (FIG. 30G). In this step, in the case where the mask layer is composed of SiO2, the isotropic etching method can be performed by wet etching process with etchant composed of a mixture of 50% hydrofluoric acid solution and 40% ammonium fluoride solution. In this etching process, the relationship between the etching depth measured in nm in the mask layer 25 and the etching time measured in seconds can be defined by a linear function as shown in FIG. 31, and hence, the mask layer 28 can be formed precisely.

Figure 30H:
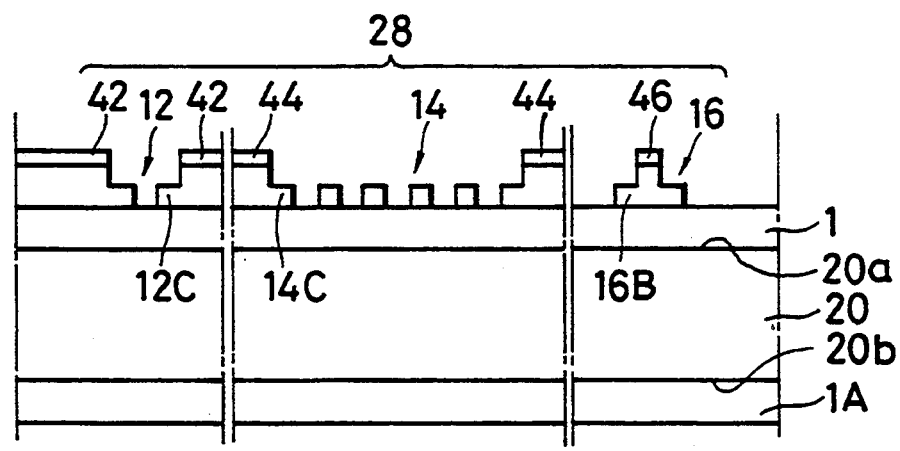

Next, using the mask layer 28 as a mask, the X-ray absorption layer 18 is etched by unisotropic etching method so that the bottoms of channels 27 may reach the X-ray transmission layer 1 and that specific patterns 12, 14 and 16 may have 0.3 $\mu$m-thick parts 12C, 14C and 16B of the X-ray absorber (FIG. 30H).

Figure 30I:
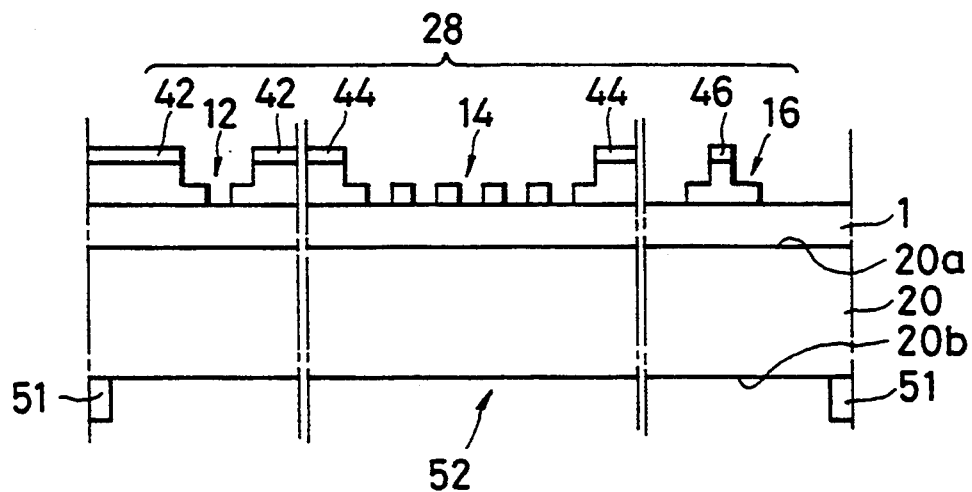

And next, on the silicon nitride film 1A formed on the main surface 20b of the substrate 20, a mask layer 51 having a window 52 which enables the region, where absorber patterns 12, 14 and 16 are formed, to direct toward outside through the substrate 20, and the X-ray transmission layer 1 is formed (FIG. 30I).

Figure 30J:
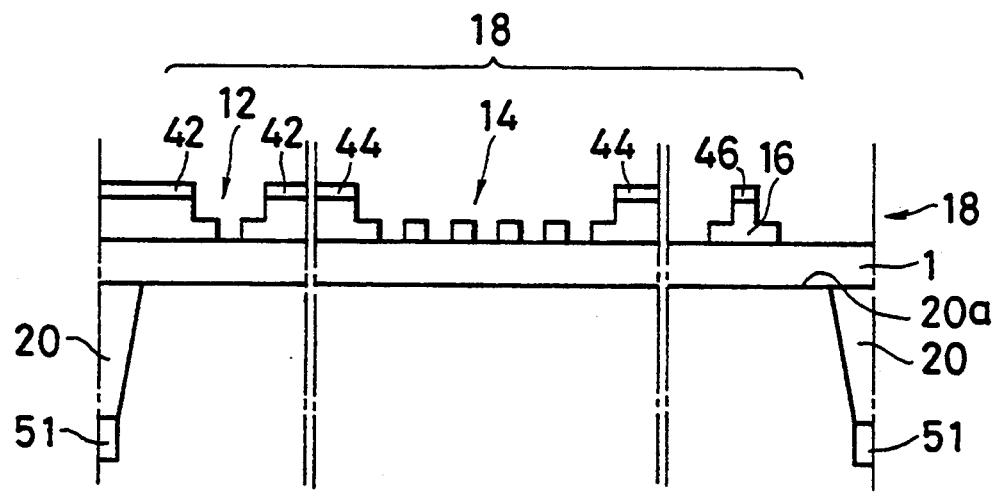

And next, using the mask layer 51 as a mask, and by unisotropic etching method, the substrate 20 is removed except for its peripheral portion to the lower face of the X-ray transmission layer 1 (FIG. 30J).

Figure 30K:
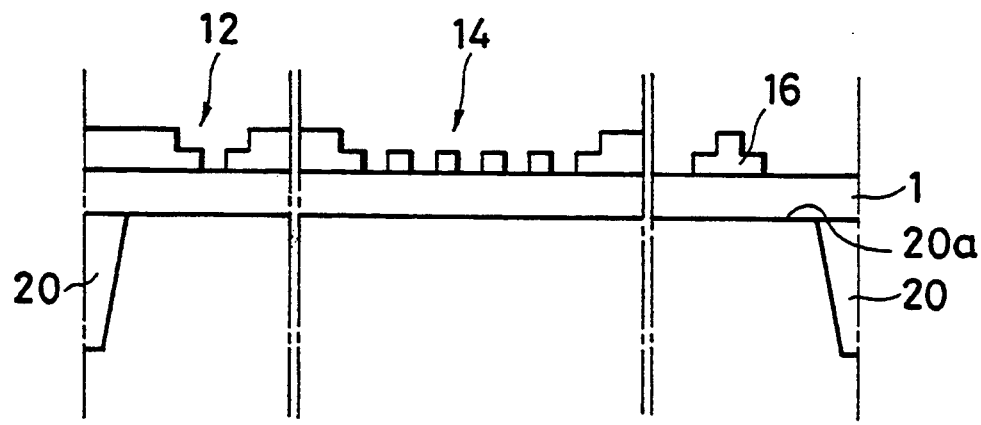

Finally, according to demand, the mask layers 28 and 51 may be removed (FIG. 30K).

Thus, the X-ray exposure mask as shown in FIG. 29 is made.

According to the above mentioned method, if only at first, the first X-ray absorption layer 1 is formed on the substrate and furthermore the first etching mask layer is formed on the first X-ray absorption layer, next an X-ray absorber pattern having parts with their thickness different from one another can be formed in self-aligning by etching the first X-ray absorption layer using the unisotropic etching method and the first etching mask layer as a mask to form the second X-ray absorber, and then by etching the first etching mask layer by isotropic etching method to form the second etching mask layer, and finally by etching the second X-ray absorption layer by unisotropic etching method and by using the second etching mask layer as a mask.

In using the X-ray mask of the present invention, the resolution and the process margin with respect to patterns including lines and spaces less than 0.2 µm can be improved, even if the proximity gap is relatively larger, in comparison with the patterning characteristics using conventional X-ray masks. And furthermore, various kinds of patterns including different sizes and geometries can be simultaneously and precisely replicated.

Additionally, the fabrication method of the above mentioned X-ray mask of the present invention, high precision X-ray masks can be fabricated in a simplified process. At the same time, manufacturing cost may be reduced with the above mentioned fabrication method.

Though in the above described embodiments materials used for absorption layers is taken to be tantalum by way of example. Gold, tungsten and other metallic materials can be used to attain the same effect as that given by tantalum only if specific characteristics on the phase shift and the mask contrast in absorption layers can be satisfied at a certain level.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An X-ray exposure mask for exposing a sample by means of a 1:1 proximity printing method with an incident X-ray from an X-ray source comprising:
   an X-ray transmission layer for transmitting an X-ray being incident On the X-ray exposure mask; and
   an X-ray absorption layer for absorbing said X-ray being incident on the X-ray exposure mask, said X-ray absorption layer formed on said X-ray transmission layer and being composed of a single material and being patterned to have a plurality of patterns with substantially right-angled edges and respective plane projection areas and thicknesses, the thickness of the respective patterns being varied in accordance with the plane projection area of the respective patterns and larger where the plane projection area is larger.

2. An X-ray exposure mask as claimed in claim 1, wherein said X-ray absorption layer has at least one first pattern having a first plane projection area and a first thickness and at least one second pattern having a second plane projection area and a second thickness, said second plane projection area being smaller than said first plane projection area and said second thickness being less than said first thickness.

3. An X-ray exposure mask as claimed in claim 2, wherein said second thickness, designated t measured in nano meters, of said second region satisfies that $$30 < |360(1-n)\, t/\lambda| < 120 \text{ and}$$

$$1 < 1/\exp(-\mu t) < 4,$$

wherein n is a refractive index of said X-ray absorption layer, $\lambda$ is a peak power wavelength of the X-ray that is incident on the X-ray mask measured in nano meters, and $\lambda$ is a linear absorption coefficient of said X-ray absorption layer measured in a reciprocal of nano meters.

4. An X-ray exposure mask as claimed in claim 3, wherein a plurality of said second patterns are formed and arranged at regular intervals.

5. An X-ray exposure mask as claimed in claim 2, wherein said first pattern further has a part with said second thickness.

6. An X-ray exposure mask as claimed in claim 5, wherein a width designated L of said second pattern satisfies that $$L \leq 1.2\, (G\lambda)^{\frac{1}{2}},$$

wherein G is a distance between a mask and said sample, and $\lambda$ is a peak power wavelength of said incident X-ray measured in micro meters.

7. An X-ray exposure mask as claimed in claim 2, wherein said X-ray absorption layer is patterned to have a window and a first X-ray absorber and a second X-ray absorber for defining said window, and each of said first X-ray absorber and said second X-ray absorber has said second region with said second thickness at an inner side whereby said window is defined, and said first region with said first thickness outside of said second region.

8. An X-ray exposure mask as claimed in claim 7, wherein a width designated L of said second region satisfies that $$L \leq 1.2\, (G\lambda)^{178},$$

wherein G is a distance between a mask and said sample, and $\lambda$ is a peak power wavelength of said incident X-ray measured in micro meters.

9. An X-ray exposure mask as claimed in claim 8, wherein said first X-ray absorber and said second X-ray absorber are extended in parallel with each other.

10. An X-ray exposure mask as claimed in claim 2, wherein a center portion of said X-ray absorption layer has said first thickness and peripheral portion of said X-ray absorption layer has said second thickness.

11. An X-ray exposure mask as claimed in claim 10, wherein a width designated L of said peripheral portion satisfies that $$L \leq 1.2\, (G\lambda)^{\frac{1}{2}},$$

wherein G is a distance between a mask and said sample, and λ is a peak wavelength of said incident X-ray measured in micro meters.

12. An X-ray exposure mask as claimed in claim 2, wherein said X-ray absorption layer is structured such that among said incident X-rays, X-rays passed through said X-ray absorption layer interfere with X-rays passed through said X-ray transmission layer and are diffracted to form an X-ray intensity profile in accordance with said pattern of said X-ray absorption layer.

13. An X-ray exposure mask as claimed in claim 1, wherein said single material substantially comprises tantalum.

14. An X-ray exposure mask for exposing a sample by means of a proximity printing method with an incident X-ray from an X-ray source comprising:
   an X-ray transmission layer for transmitting the incident X-ray; and
   an X-ray absorption layer for absorbing said incident X-ray, said absorption layer comprising a single material formed on said X-ray transmission layer and patterned to have at least one first pattern including a first X-ray absorber and a second X-ray absorber arranged apart from each other, said first and second X-ray absorbers having an inner portion for defining a window and an outer portion being connected with said inner portions, respectively, said outer portion having a first plane projection area and a first thickness and said inner portion having a second plane projection area smaller than said first plane projection area and a second thickness less than said first thickness; a second pattern including a third X-ray absorber, a fourth X-ray absorber and at least one fifth X-ray absorber placed between said third and fourth X-ray absorbers with an interval, said third and fourth X-ray absorbers having an inner portion for defining a window in co-operation with said fifth X-ray absorber and an outer portion being connected with said inner portion, respectively, said outer portions of said third and fourth X-ray absorbers having said first thickness and said inner portions of said third and fourth X-ray absorbers and said at least one fifth x-ray absorber having said second thickness; and a third pattern composed of a sixth X-ray absorber extended in a striped geometry, a central portion of said sixth X-ray absorber having said first thickness and side portions along the periphery of said sixth X-ray absorber having said second thickness.

15. An X-ray exposure mask as claimed in claim 14, wherein width of said inner portions of said first and second X-ray absorbers, said inner portions of said third and fourth X-ray absorbers and said side portions of said sixth X-ray absorber does not exceed $$1.2(G\lambda)^{\frac{1}{2}},$$

wherein G is a distance between a mask and an exposure sample, and λ is a peak power wavelength of said incident X-ray measured in micro meters.

16. An X-ray exposure mask as claimed in claim 14, wherein a plurality of said fifth X-ray absorbers are arranged at regular intervals.

17. An X-ray exposure mask as claimed in claim 14, wherein said second thickness, designated t measured in nano meters, satisfies that $$30 < |360(1-n)t/\lambda| < 120 \text{ and}$$

$$1 < 1/\exp(-\mu t) < 4,$$

wherein n is a refractive index of said X-ray absorption layer, λ is a peak power wavelength of said incident X-ray measured in nano meters, and μ is a linear absorption coefficient of said X-ray absorption layer measured in a reciprocal of nano meters.

18. A process for fabricating an X-ray exposure mask comprising the steps of:
   forming an X-ray transmission layer on a substrate;
   forming an X-ray absorption layer composed of a single material on said X-ray transmission layer;
   forming a first etching mask layer including patterns on said X-ray absorption layer;
   forming a channel on said X-ray absorption layer by unisotropic etching process using said first etching mask layer;
   forming a second etching mask layer by removing a designated amount of said first etching mask layer from its side face and its upper face by isotopic etching of said first etching mask layer; and
   forming an X-ray absorption layer composed of specific patterns, said X-ray absorption layer having an edge part, the thickness of which is smaller than the thickness of a region below said second etching mask layer, by using said second etching mask layer as a mask and by unisotropic etching process for removing said X-ray absorption layer.

* * * * *

UNITED STATES PATENT AND TRADEMARK OFFICE
CERTIFICATE OF CORRECTION

PATENT NO. : 5,414,746
DATED : May 9, 1995
INVENTOR(S) : Kimiyoshi DEGUCHI, et al.

It is certified that error appears in the above-indentified patent and that said Letters Patent is hereby corrected as shown below:

Column 1, line 12, change "thereof." to --therefor.--.

Column 1, line 64, change "ofter" to --often--.

Column 1, line 65, insert --the-- before "pattern".

Column 2, line 52, change "responsive" to --response--.

Column 3, line 19, delete "a" before "well-like".

Column 4, line 32, change "another" to --other--.

Column 7, line 65, insert --of-- after "region".

Column 7, line 66, change "absorber" to --absorbers--.

Column 8, line 21, change "$\lambda$" to --$\mu$--.

Column 8, line 23, change "meter." to --meters.--.

Column 10, line 21, change "pules" to --plane--.

Column 11, line 34, change "designed" to --designated--.

Column 11, line 58, insert --with-- after "interfere".

UNITED STATES PATENT AND TRADEMARK OFFICE
CERTIFICATE OF CORRECTION

PATENT NO. : 5,414,746
DATED : May 9, 1995
INVENTOR(S) : Kimiyoshi DEGUCHI, et al.

It is certified that error appears in the above-indentified patent and that said Letters Patent is hereby corrected as shown below:

Column 12, line 17, delete "the" at the end of the line.

Column 12, line 24, change "distributes" to --is distributed--.

Column 14, line 62, change "are" to --is--.

Column 15, line 4, change "the" to --a--.

Column 16, line 21, change "02" to --$O_2$--.

Column 16, line 51, change "02" to --$O_2$--.

Column 17, lines 17 and 18, change "self-aligning" to --self-alignment--.

Column 17, line 40, change "is" to --are--.

Column 18, line 52, change "$(G\lambda)^{178}$" to --$(G\lambda)^{\frac{1}{2}}$--.

Signed and Sealed this

Twentieth Day of February, 1996

Attest:

BRUCE LEHMAN

Attesting Officer

Commissioner of Patents and Trademarks